(12) United States Patent
Kadota et al.

(10) Patent No.: US 11,195,855 B2
(45) Date of Patent: Dec. 7, 2021

(54) SEMICONDUCTOR MEMORY DEVICE AND METHOD OF MANUFACTURING THE SAME

(71) Applicant: Kioxia Corporation, Minato-ku (JP)

(72) Inventors: Kenichi Kadota, Yokkaichi (JP); Kazuhiro Nojima, Mie (JP); Taro Shiokawa, Nagoya (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 16/794,323

(22) Filed: Feb. 19, 2020

(65) Prior Publication Data
US 2021/0066339 A1    Mar. 4, 2021

(30) Foreign Application Priority Data

Sep. 2, 2019 (JP) .............................. JP2019-159689

(51) Int. Cl.
*H01L 27/11582* (2017.01)
*H01L 23/522* (2006.01)
(Continued)

(52) U.S. Cl.
CPC ...... *H01L 27/11582* (2013.01); *H01L 23/528* (2013.01); *H01L 23/5226* (2013.01);
(Continued)

(58) Field of Classification Search
CPC ......... H01L 27/11582; H01L 27/11565; H01L 27/11556; H01L 27/11519; H01L 27/11521; H01L 27/11551; H01L 27/11568; H01L 27/11578; H01L 27/11597; H01L 23/5226; H01L 23/528; H01L 23/53266; H01L 29/40117; H01L 29/40114; H01L 21/31111; H01L 21/28568; H01L 21/31053; H01L 21/3065; H01L 21/30604; H01L 21/764
See application file for complete search history.

(56) References Cited

U.S. PATENT DOCUMENTS 8,933,502 B2 * 1/2015 Higashitani ....... H01L 23/53209
257/326
10,090,319 B2  10/2018 Fujiki et al.
(Continued)

FOREIGN PATENT DOCUMENTS

JP       2019-067825 A    4/2019

*Primary Examiner* — Galina G Yushina
(74) *Attorney, Agent, or Firm* — Oblon, McClelland, Maier & Neustadt, L.L.P.

(57) ABSTRACT

According to one embodiment, a semiconductor memory device includes: a plurality of first interconnect layers including first and second conductors; a second interconnect layer arranged above the first interconnect layers; a third interconnect layer arranged adjacently to the second interconnect layer; a first pillar passing through the first interconnect layers and the second interconnect layer; a second pillar passing through the first interconnect layers and the third interconnect layer; and a third pillar arranged between the second interconnect layer and the third interconnect layer and passing through the first interconnect layers. The second conductor covers a top surface and a bottom surface of the first conductor, and a side surface of an end portion of the first conductor.

14 Claims, 19 Drawing Sheets

(51) Int. Cl.
  H01L 23/528   (2006.01)
  H01L 27/11556 (2017.01)
  H01L 21/28    (2006.01)
  H01L 27/11565 (2017.01)
  H01L 21/311      (2006.01)
  H01L 27/11519    (2017.01)
  H01L 23/532      (2006.01)
  H01L 21/285      (2006.01)
  H01L 21/3105     (2006.01)
  H01L 21/3065     (2006.01)
  H01L 21/306      (2006.01)
  H01L 21/764      (2006.01)

(52) U.S. Cl.
  CPC .. H01L 27/11565 (2013.01); H01L 29/40117 (2019.08); H01L 21/28568 (2013.01); H01L 21/3065 (2013.01); H01L 21/30604 (2013.01); H01L 21/31053 (2013.01); H01L 21/31111 (2013.01); H01L 21/764 (2013.01); H01L 23/53266 (2013.01); H01L 27/11519 (2013.01); H01L 27/11556 (2013.01); H01L 29/40114 (2019.08)

(56) References Cited

U.S. PATENT DOCUMENTS

| | | |
|---|---|---|
| 2009/0267128 A1 | 10/2009 | Maejima |
| 2009/0268522 A1 | 10/2009 | Maejima |
| 2010/0207195 A1 | 8/2010 | Fukuzumi et al. |
| 2011/0284946 A1 | 11/2011 | Kiyotoshi |
| 2015/0235939 A1* | 8/2015 | Lee .................. H01L 27/11573 257/774 |
| 2016/0284722 A1 | 9/2016 | Lai |
| 2017/0194345 A1* | 7/2017 | Nojima ............. H01L 27/11565 |
| 2019/0096899 A1* | 3/2019 | Tagami ............. H01L 27/11582 |
| 2019/0287995 A1* | 9/2019 | Oike ................. H01L 27/1157 |
| 2019/0371813 A1* | 12/2019 | Oike ................. H01L 27/11565 |

* cited by examiner

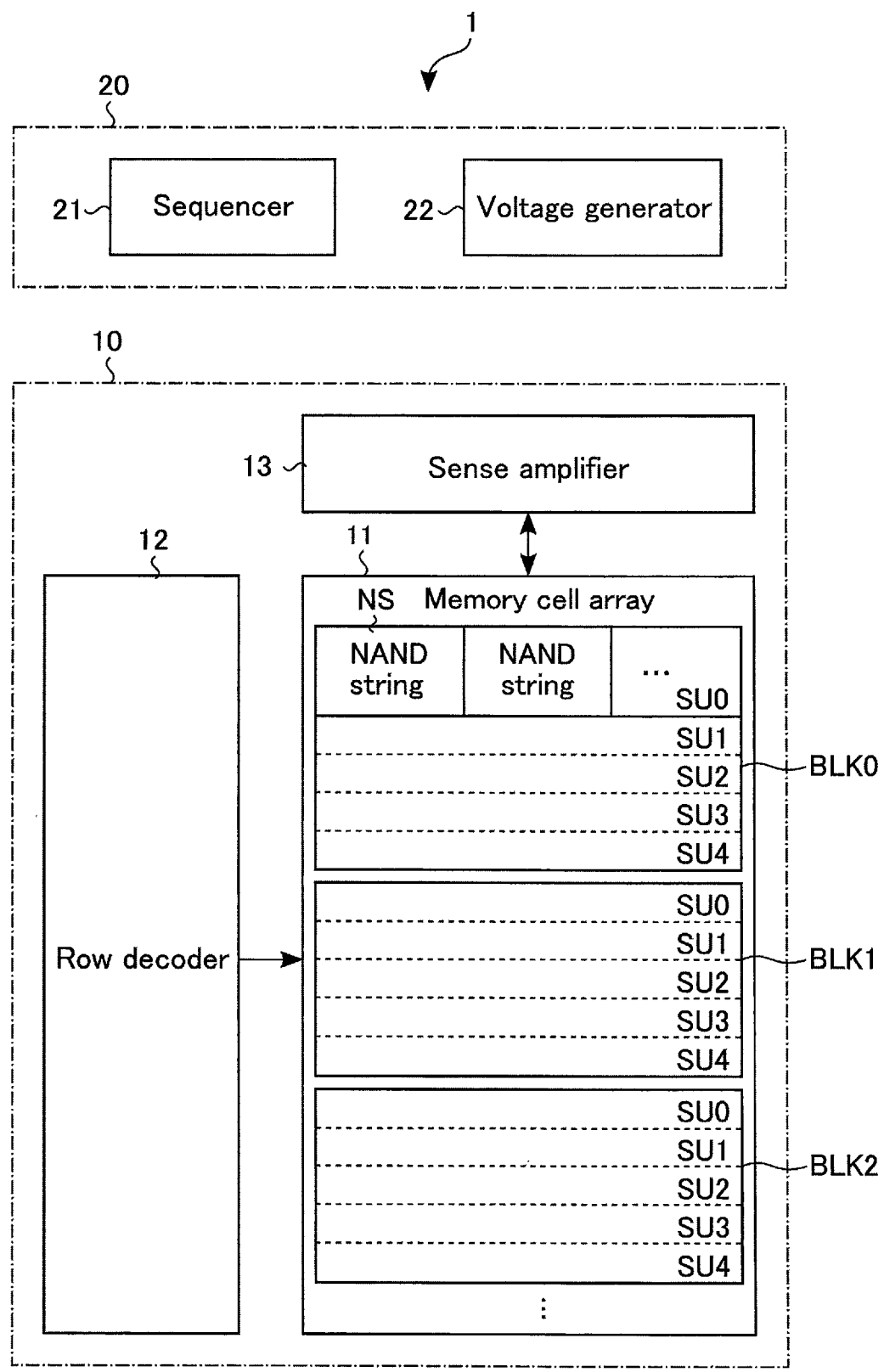
F I G. 1

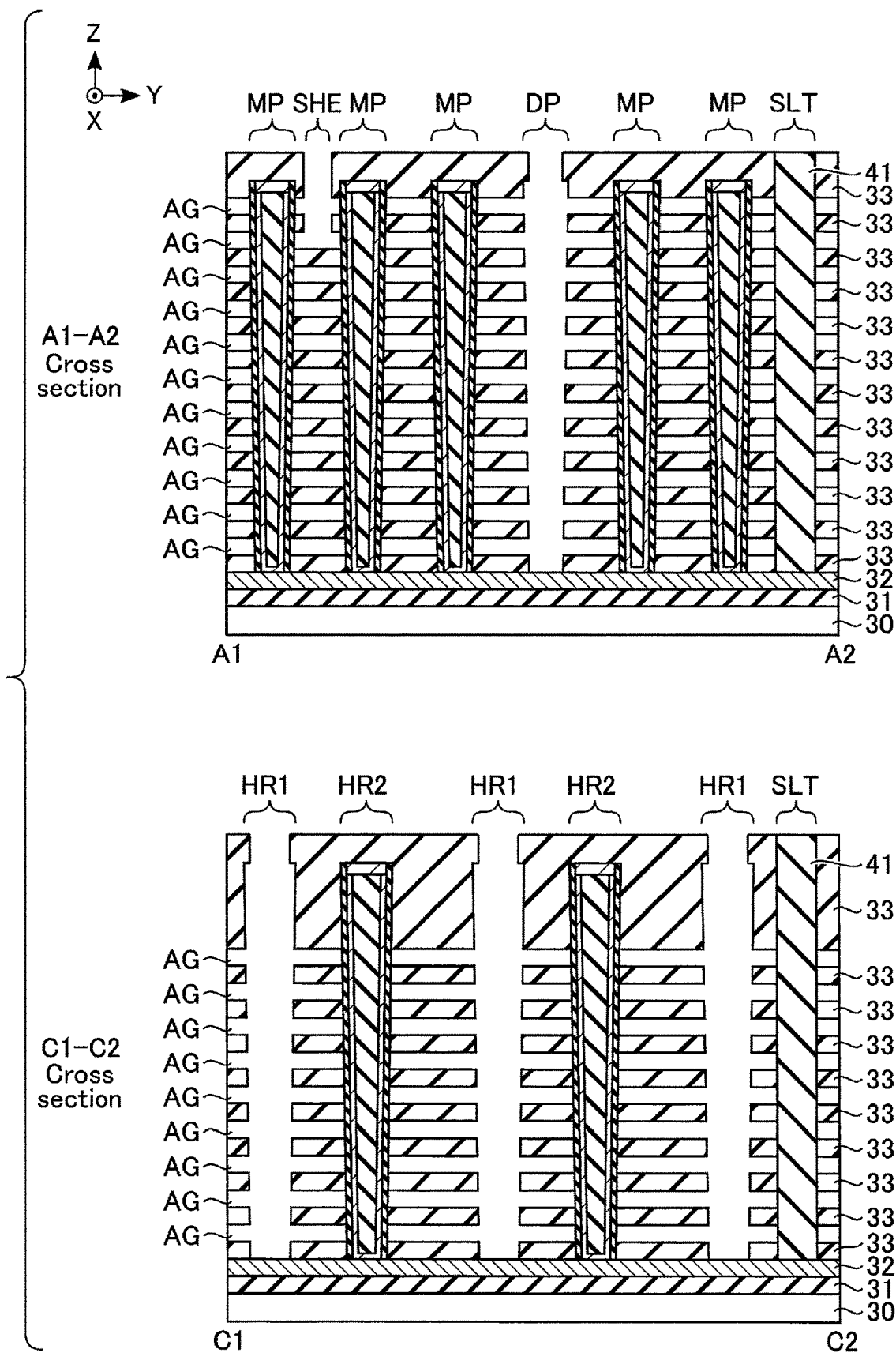
F I G. 16

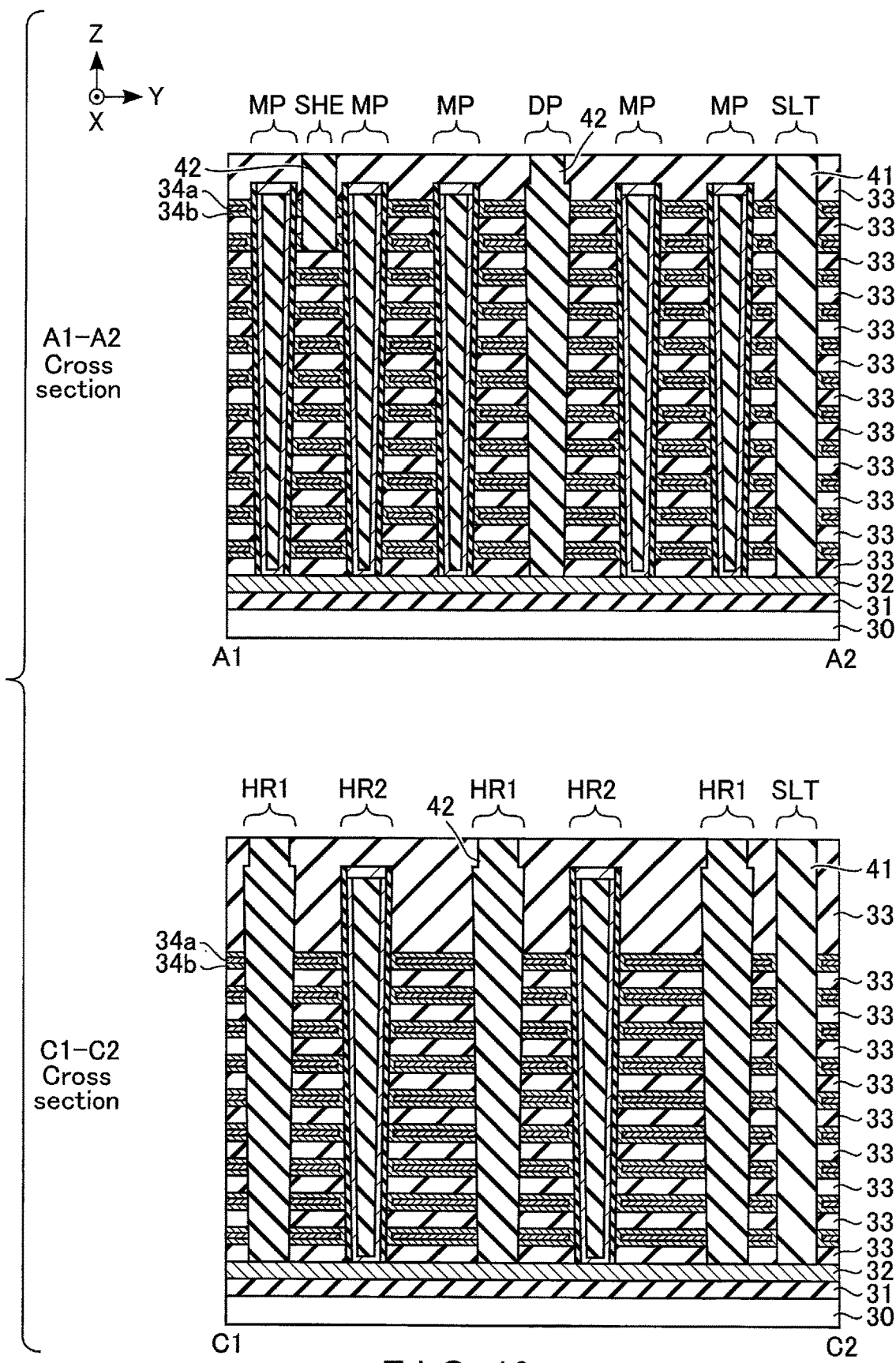
F I G. 19

SEMICONDUCTOR MEMORY DEVICE AND METHOD OF MANUFACTURING THE SAME

CROSS-REFERENCE TO RELATED APPLICATIONS

This application is based upon and claims the benefit of priority from Japanese Patent Application No. 2019-159689, filed Sep. 2, 2019, the entire contents of which are incorporated herein by reference.

FIELD

Embodiments described herein relate generally to a semiconductor memory device and method of manufacturing the same.

BACKGROUND

A NAND flash memory is known as a semiconductor memory device.

BRIEF DESCRIPTION OF THE DRAWINGS

FIG. 1 is a block diagram of a semiconductor memory device according to a first embodiment;

FIGS. 9-19 are sets of cross-sectional views of a memory cell array showing a step in the manufacturing of the semiconductor memory device according to one embodiment.

DETAILED DESCRIPTION

Figure 2:
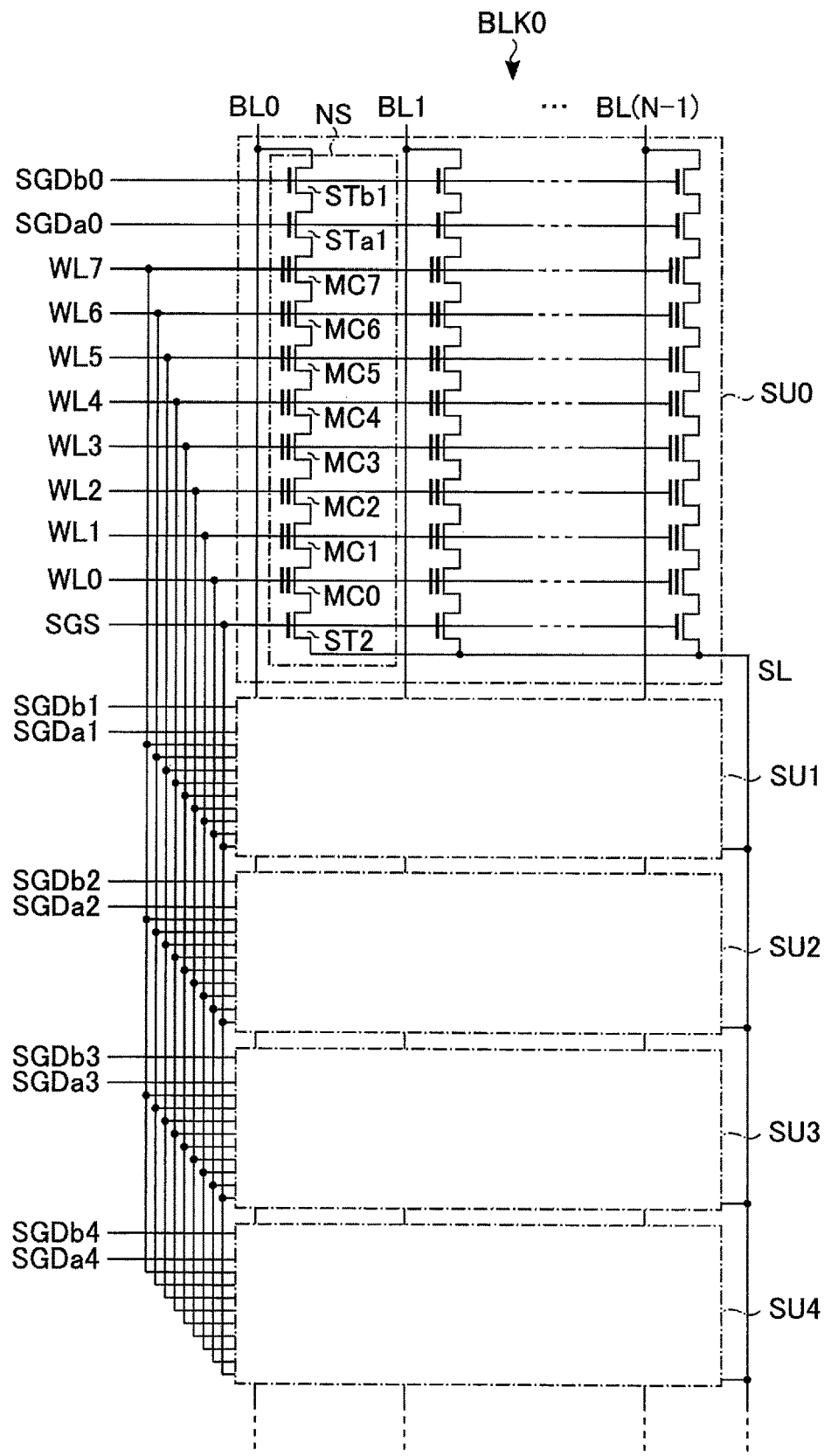
FIG. 2 is a circuit diagram of a memory cell array in the semiconductor memory device according to the first embodiment.

In general, according to one embodiment, a semiconductor memory device includes: a plurality of first interconnect layers stacked separately in a first direction that intersects a substrate, and each including a first conductor and a second conductor covering a part of the first conductor; a second interconnect layer arranged above the plurality of first interconnect layers; a third interconnect layer arranged above the plurality of first interconnect layers, and arranged adjacently to the second interconnect layer in a second direction that is parallel to the substrate and intersects the first direction; a first pillar passing through the plurality of first interconnect layers and the second interconnect layer, extending in the first direction, and including a first semiconductor layer; a second pillar passing through the plurality of first interconnect layers and the third interconnect layer, extending in the first direction, and including a second semiconductor layer; and a third pillar arranged between the second interconnect layer and the third interconnect layer in the second direction, passing through the plurality of first interconnect layers, extending in the first direction, and having an insulation property. The second conductor covers a top surface and a bottom surface of the first conductor, and a side surface of an end portion of the first conductor in the second direction.

Hereinafter, embodiments will be described with reference to the accompanying drawings. In the description below, structural elements having substantially the same functions and configurations will be denoted by the same reference symbols, and a repetitive description of such elements will be given only where necessary. Each of the embodiments described below merely indicates an exemplary apparatus or method for implementing the technical idea of the embodiment. The element materials, shapes, structures, arrangements, etc. of the technical ideas of the embodiments are not limited to the ones described below. The technical ideals of the embodiments may be varied within the range of the claims.

In the following, as a semiconductor memory device, a three-dimensional stacked NAND-type flash memory with memory cell transistors stacked three-dimensionally on a semiconductor substrate will be described by way of example.

1. Configuration

1.1 Overall Configuration of Semiconductor Memory Device

First, an overall configuration of a semiconductor memory device will be described with reference to FIG. 1. FIG. 1 is an example of a block diagram showing a basic overall configuration of the semiconductor memory device.

As shown in FIG. 1, a semiconductor memory device 1 includes a memory core unit 10 and a peripheral circuit unit 20.

The memory core unit 10 includes a memory cell array 11, a row decoder 12, and a sense amplifier 13.

The memory cell array 11 comprises a plurality of blocks BLK (BLK0, BLK1, BLK2, . . . ). Each of the blocks BLK includes a plurality (five in the present embodiment) of string units SU (SU0 to SU4). Each string unit SU is a group of NAND strings NS each having memory cell transistors coupled in series. The number of the blocks BLK in the memory cell array 11 and the number of the string units SU in a block BLK can be set discretionarily.

The row decoder 12 decodes a row address received from an external controller (not shown). The row decoder 12 selects a row direction of the memory cell array 11 based on the decoding result. More specifically, the row decoder 12 applies voltages to various interconnects for selecting the row direction.

When reading data, the sense amplifier 13 senses data read from one block BLK. When writing data, the sense amplifier 13 applies voltages corresponding to write data to the memory cell array 11.

The peripheral circuit unit 20 includes a sequencer 21 and a voltage generator 22.

The sequencer 21 controls the entire operation of the semiconductor memory device 1. More specifically, the sequencer 21 controls the voltage generator 22, the row decoder 12, and the sense amplifier 13, etc. at the time of a write operation, a read operation, and an erase operation.

The voltage generator 22 generates voltages used for the write operation, the read operation, and the erase operation, and supplies the generated voltages to the row decoder 12 and the sense amplifier 13, etc.

1.2 Circuit Configuration of Memory Cell Array

Next, a configuration of the memory cell array 11 will be described with reference to FIG. 2. The example of FIG. 2 shows the block BLK0. Other blocks BLK have the same configurations. As illustrated in FIG. 2, the block BLK0 includes, for example, five string units SU0 to SU4. Each string unit SU includes a plurality of NAND strings NS. Each NAND string NS includes, for example, eight memory cell transistors MC (MC0 to MC7) and selection transistors STa1, STb1, and ST2. Each memory cell transistor MC is provided with a control gate and a charge storage layer, and stores data in a nonvolatile manner. In the following, the memory cell transistors MC0 to MC7 will be referred to as a "memory cell transistor MC" unless otherwise specified.

The memory cell transistor MC may be of a MONOS type using an insulating film for the charge storage layer, or of an FG type using a conductive layer for the charge storage layer. In the present embodiment, a MONOS-type memory cell transistor MC will be described by way of example. The number of the memory cell transistors MC is not limited to 8, but may be 16, 32, 64, 96, or 128, for example. The number of the memory cell transistors MC is not limited to a specific value. The example of FIG. 2 shows an example where one NAND string NS includes two selection transistors ST1 (STa1 and STb1) and one selection transistor ST2. However, one NAND string NS may include one or more selection transistors ST1 and one or more selection transistors ST2.

In the NAND string NS, current paths are coupled in series in the order of a selection transistor ST2, memory cell transistors MC0 to MC7, and selection transistors STa1 and STb1. The drain of the selection transistor STb1 is coupled to a corresponding bit line BL. The source of the selection transistor ST2 is coupled to a source line SL.

The control gates of the memory cell transistors MC0 to MC7 of each NAND string NS in the same block ELK are respectively coupled in common to different word lines WL0 to WL7. More specifically, for example, the control gates of a plurality of memory cell transistors MC0 in a block BLK are coupled in common to the word line WL0.

A plurality of selection transistors STa1 in the string units SU0 to SU4 are respectively coupled in common to the corresponding select gate lines SGDa0 to SGDa4. Similarly, a plurality of selection transistors STb1 in the string units SU0 to SU4 are respectively coupled in common to the corresponding select gate lines SGDb0 to SGDb4. For example, in the string unit SU0, gates of the plurality of selection transistors STa1 are coupled in common to the select gate line SGDa0, and gates of the plurality of selection transistors STb1 are coupled in common to the select gate line SGDb0. The same applies to the string units SU1 to SU4. The select gate lines SGDa0 to SGDa4 will be referred to as a "select gate line SGDa" unless otherwise specified, and the select gate lines SGDb0 to SGDb4 will be referred to as a "select gate line SGDb" unless otherwise specified.

The gates of the selection transistors ST2 in the same block BLK are coupled in common to the select gate line SGS. The gates of the selection transistors ST2 in the string units SU0 to SU4 may be coupled to different select gate lines SGS for each string unit SU.

In a string unit SU, the plurality of selection transistors STb1 have their drains coupled to different bit lines BL (BL0 to BL(N−1), N being an integer of 2 or more). In other words, a plurality of NAND strings NS in a string unit SU are respectively coupled to different bit lines BL. A bit line BL couples one NAND string NS in each string unit SU in common.

The sources of the selection transistors ST2 in a plurality of blocks BLK are coupled in common to a source line SL.

In other words, a string unit SU is an assembly of NAND strings NS coupled to the different bit lines BL and coupled to the same select gate lines SGDa and SGDb. Each of the blocks BLK is an assembly of a plurality of string units SU sharing the word lines WL. The memory cell array 11 is an assembly of the plurality of blocks BLK sharing the bit lines BL.

The configuration of the memory cell array 11 may be a different configuration. The configuration of the memory cell array 11 is described in U.S. patent application Ser. No. 12/407,403 filed on Mar. 19, 2009 and titled "THREE DIMENSIONAL STACKED NONVOLATILE SEMICONDUCTOR MEMORY," for example. The configuration of the memory cell array 11 is also described in U.S. patent application Ser. No. 12/406,524 filed on Mar. 18, 2009 and titled "THREE DIMENSIONAL STACKED NONVOLATILE SEMICONDUCTOR MEMORY," U.S. patent application Ser. No. 12/679,991 filed on Mar. 25, 2010 and titled "NON-VOLATILE SEMICONDUCTOR STORAGE DEVICE AND METHOD OF MANUFACTURING THE SAME," and U.S. patent application Ser. No. 12/532,030 filed on Mar. 23, 2009 and titled "SEMICONDUCTOR MEMORY AND METHOD FOR MANUFACTURING SAME." The entire contents of these applications are incorporated herein by reference.

1.3 Planar Configuration of Memory Cell Array

Figure 3:
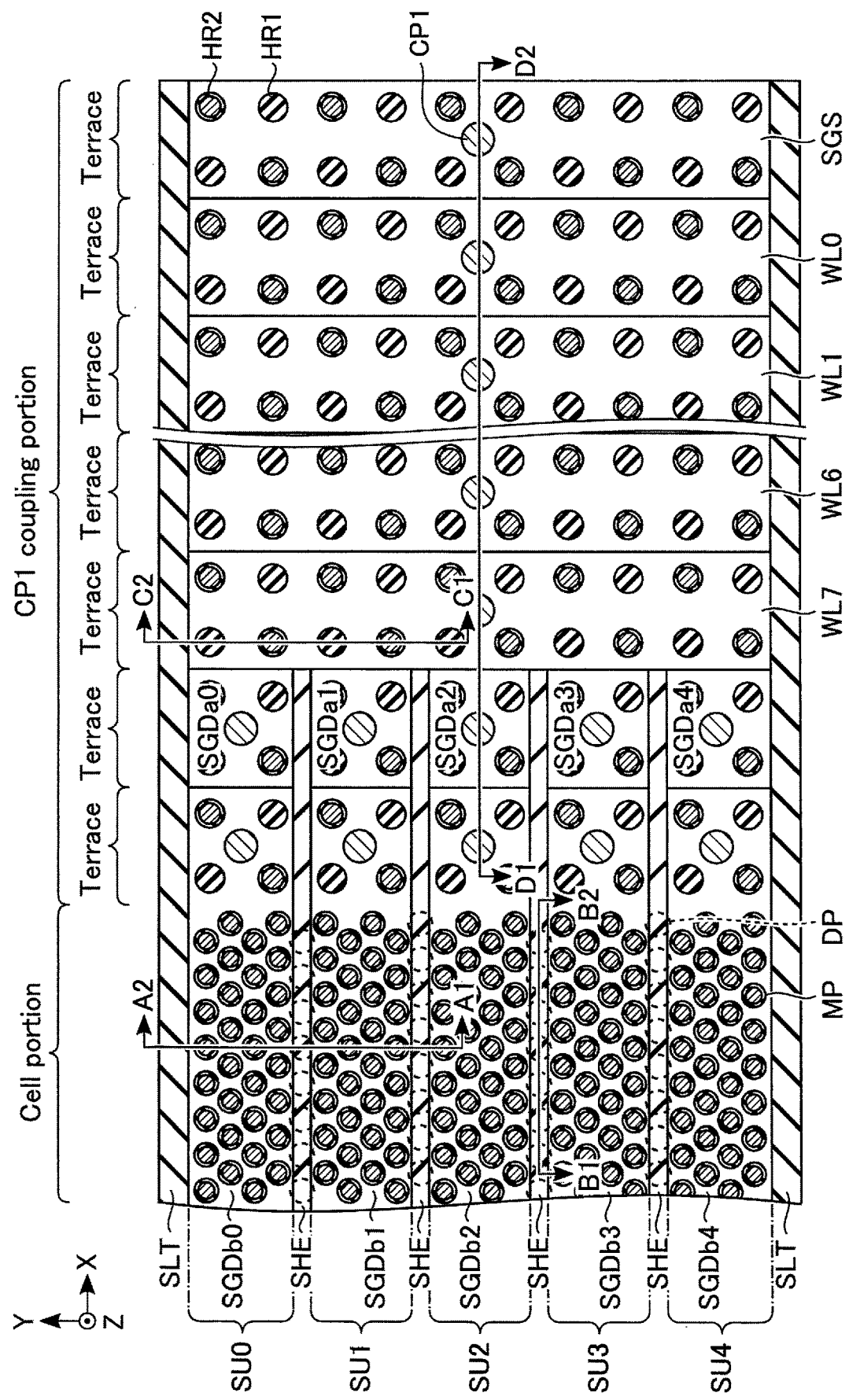
FIG. 3 is a plan view of the memory cell array in the semiconductor memory device according to the first embodiment.

Next, a planar configuration of the memory cell array 11 will be described with reference to FIG. 3. FIG. 3 is a plan view of the string units SU0 to SU4 in one block BLK. In the example of FIG. 3, interlayer insulating films are omitted.

As shown in FIG. 3, in the present embodiment, a plurality of interconnect layers corresponding to the select gate line SGS, word lines WL0 to WL7, and select gate lines SGDa and SGDb sequentially provided from the bottom are separately stacked in the Z direction approximately perpendicular to the semiconductor substrate. The plurality of interconnect layers corresponding to the select gate line SGS, word lines WL0 to WL7, and select gate lines SGDa and SGDb extend in the X direction that is approximately parallel to the semiconductor substrate and intersects the Z direction. The string units SU0 to SU4 are provided adjacently in the Y direction that is approximately parallel to the semiconductor substrate and intersects the X direction. More specifically, the select gate lines SGDa and SGDb are divided for each string unit SU by four slits SHE extending in the X direction. In other words, the select gate lines SGDa0 to SGDa4 of the string units SU0 to SU4 are adjacently provided in the Y direction. Similarly, the select gate lines SGDb0 to SGDb4 of the string units SU0 to SU4 are adjacently provided in the Y direction. The slits SHE do not divide the word lines WL and select gate line SGS arranged below the select gate lines SGDa and SGDb. In other words, the string units SU0 to SU4 share the word lines WL and the select gate line SGS below the select gate lines SGDa and SGDb. A pair of slits SLT are formed on the side surfaces of the string units SU0 and SU4 facing the Y direction. The slits SLT are arranged to divide the select gate lines SGDa and SGDb, word lines WL, and the select gate line SGS for each block BLK.

Each block BLK includes a cell portion and a CP1 coupling portion.

The cell portion is provided with a plurality of memory pillars MP each corresponding to a NAND string NS. Details of a structure of a memory pillar MP will be explained later.

In the present embodiment, a plurality of dummy pillars DP are provided under a slit SHE. In other words, a plurality of dummy pillars DP of which upper parts are connected by a slit SHE are provided.

The select gate lines SGDa, SGDb, and SGS and the word lines WL may be formed by, for example, a method in which sacrificial layers form structures corresponding to respective interconnect layers, and are then replaced with a conductive material so as to form interconnect layers (hereinafter referred to as a "replacement"). In the replacement, gaps are formed by removing the sacrificial layers, and then filled with the conductive material. The dummy pillars DP are used as holes for removing the sacrificial layers at the time of replacement, and are not electrically coupled to other interconnect layers.

In the example shown in FIG. 3, the memory pillars MP and the dummy pillars DP are aligned in 24 staggered lines in the X direction. More specifically, the memory pillars MP are arranged in 4 staggered lines for every string unit SU. Between adjacent string units SU, a plurality of dummy pillars DP are aligned in a single line along the X direction, and the upper parts of the dummy pillars DP are connected by a slit SHE. The alignment of the memory pillars MP and the dummy pillars DP is set discretionarily.

The plurality of memory pillars MP extend in the Z direction, each passing through the select gate lines SGDa and SGDb, word lines WL, and the select gate line SGS. The upper end of one memory pillar MP for each string unit SU is, for example, coupled in common by a bit line BL (not shown) extending in the Y direction.

In the CP1 coupling portion, a plurality of contact plugs CP1 are respectively coupled to the select gate lines SGDa, SGDb, and SGS and the word lines WL. Each of the select gate lines SGDa, SGDb, and SGS and the word lines WL is coupled to the row decoder 12 via the contact plug CP1.

In the CP1 coupling portion, a plurality of interconnect layers respectively corresponding to the select gate lines SGDa, SGDb, and SGS and the word lines WL are drawn stepwise in the X direction. Each interconnect layer has an area for coupling the interconnect layer to the contact plug CP1. The area for coupling is hereinafter referred to as a "terrace."

In the example shown in FIG. 3, in each string unit, terraces corresponding to the select gate lines SGDb and SGDa are arranged in one line in the X direction from the cell portion toward the CP1 coupling portion. Between a pair of slits SLT, terraces corresponding to the word lines WL7 to WL0 and the select gate line SGS are arranged in one line in the X direction from the cell portion toward the CP1 coupling portion. The terraces may be arranged discretionarily.

The CP1 coupling portion is provided with two types of dummy pillars HR1 and HR2 that penetrates (passes through) a plurality of interconnect layers respectively corresponding to the select gate lines SGDa, SGDb, and SGS and the word lines WL.

More specifically, for example, dummy pillars HR1 and HR2 provided on the terrace corresponding to the select gate line SGDb penetrate the plurality of interconnect layers functioning as the select gate lines SGDb and SGDa, the word lines WL7 to WL0, and the select gate line SGS from the upper layer. Moreover, for example, dummy pillars HR1 and HR2 provided on the terrace corresponding to the word line WL7 penetrate the plurality of interconnect layers functioning as the word lines WL7 to WL0 and the select gate line SGS from the upper layer.

At the time of replacement, the dummy pillar HR1 is used as a hole for removing the sacrificial layers similarly to the dummy pillar DP. The dummy pillar HR2 functions as a column for supporting the interlayer insulating films having gaps. The dummy pillars HR1 and HR2 are not electrically coupled to other interconnect layers. The dummy pillars HR1 and HR2 may be arranged discretionarily. Similarly to the dummy pillars DP provided in the cell portion, the upper parts of the plurality of dummy pillars HR1 may be connected by the slit SHE.

1.4 Cross-sectional Configuration of Memory Cell Array

Figure 4:
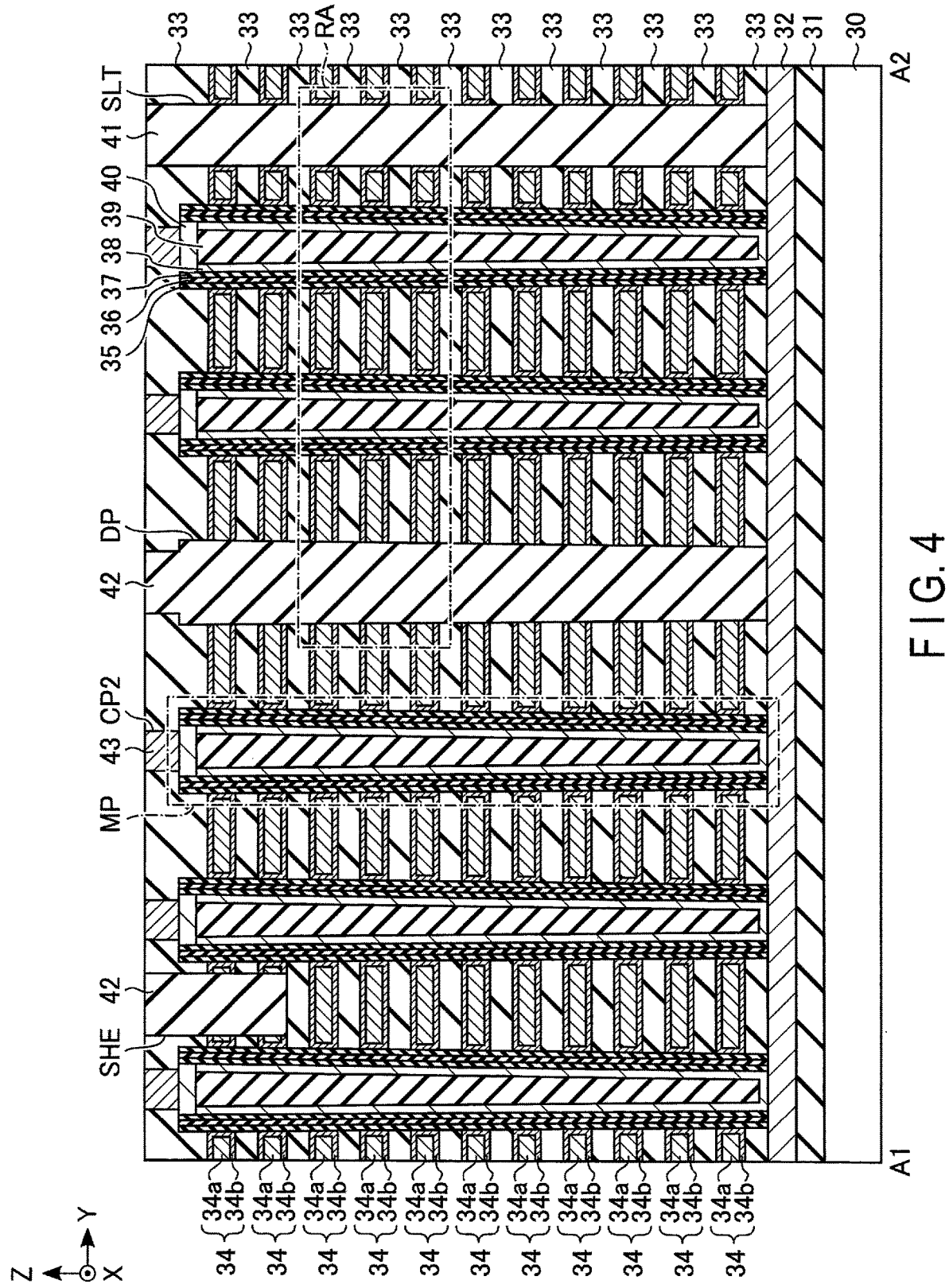
FIG. 4 is a cross-sectional view taken along line A1-A2 shown in FIG. 3.
Figure 5:
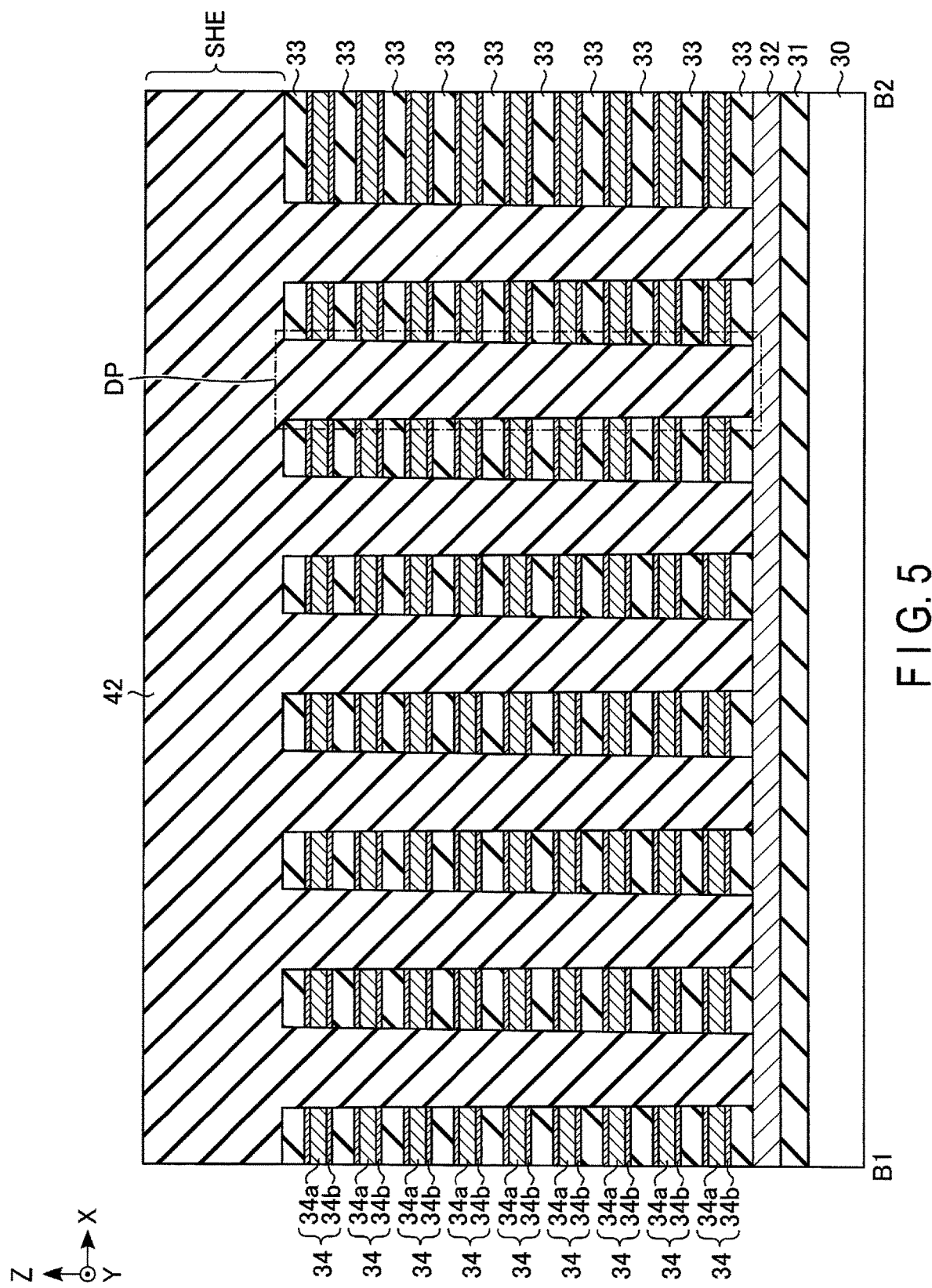
FIG. 5 is a cross-sectional view taken along line B1-B2 shown in FIG. 3.
Figure 6:
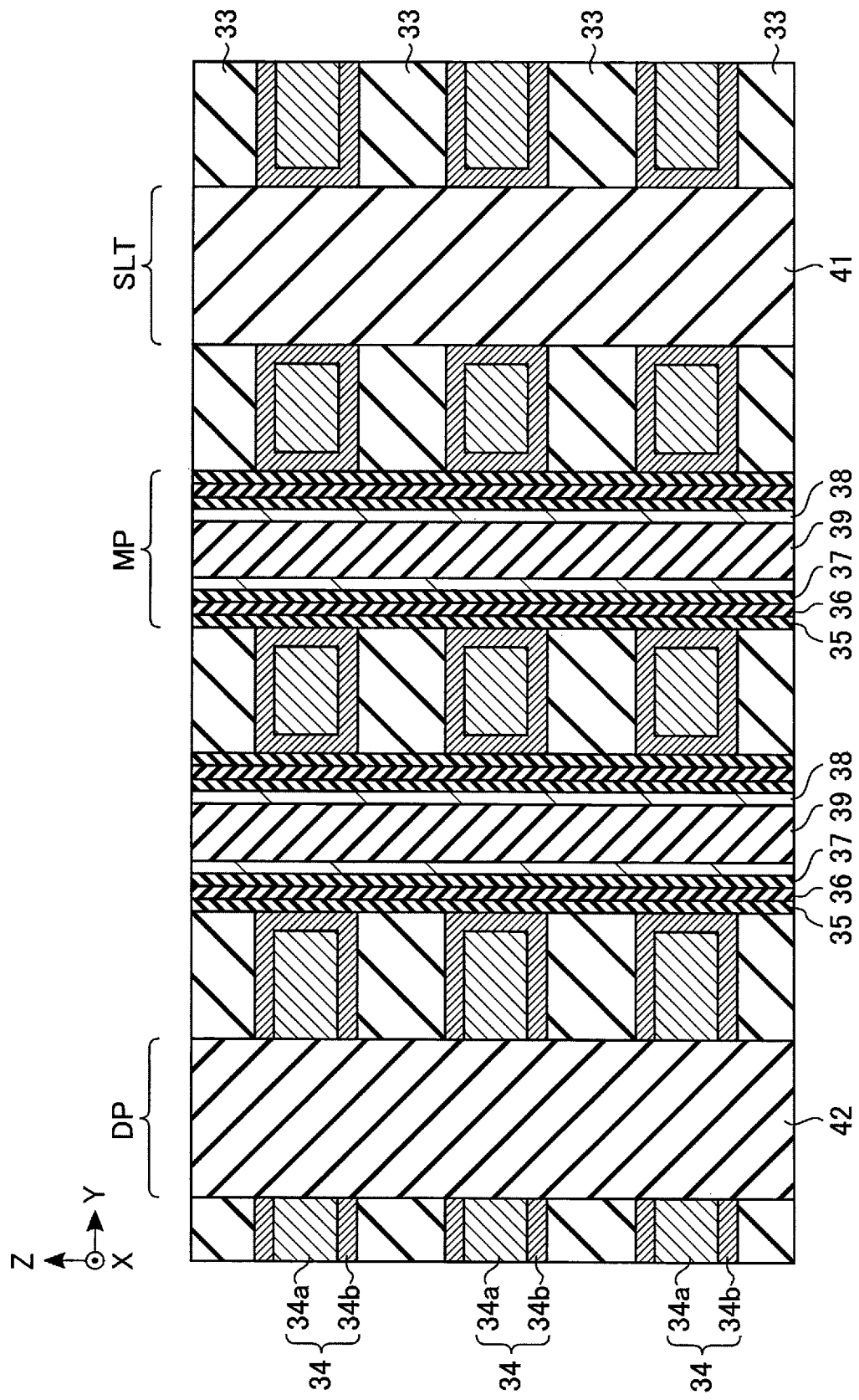
FIG. 6 is an enlarged view of a region RA shown in FIG. 4.
Figure 7:
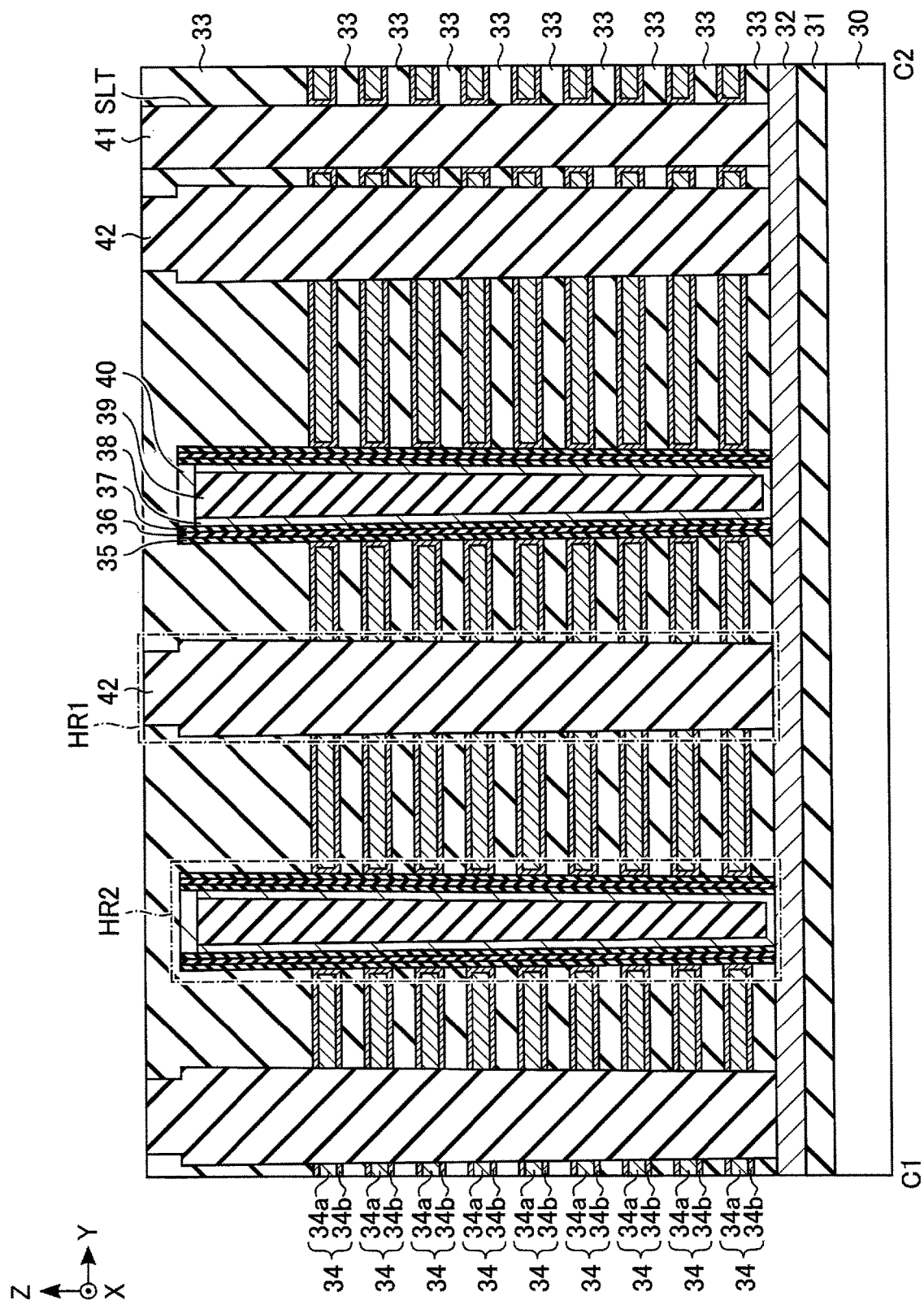
FIG. 7 is a cross-sectional view taken along line C1-C2 shown in FIG. 3.
Figure 8:
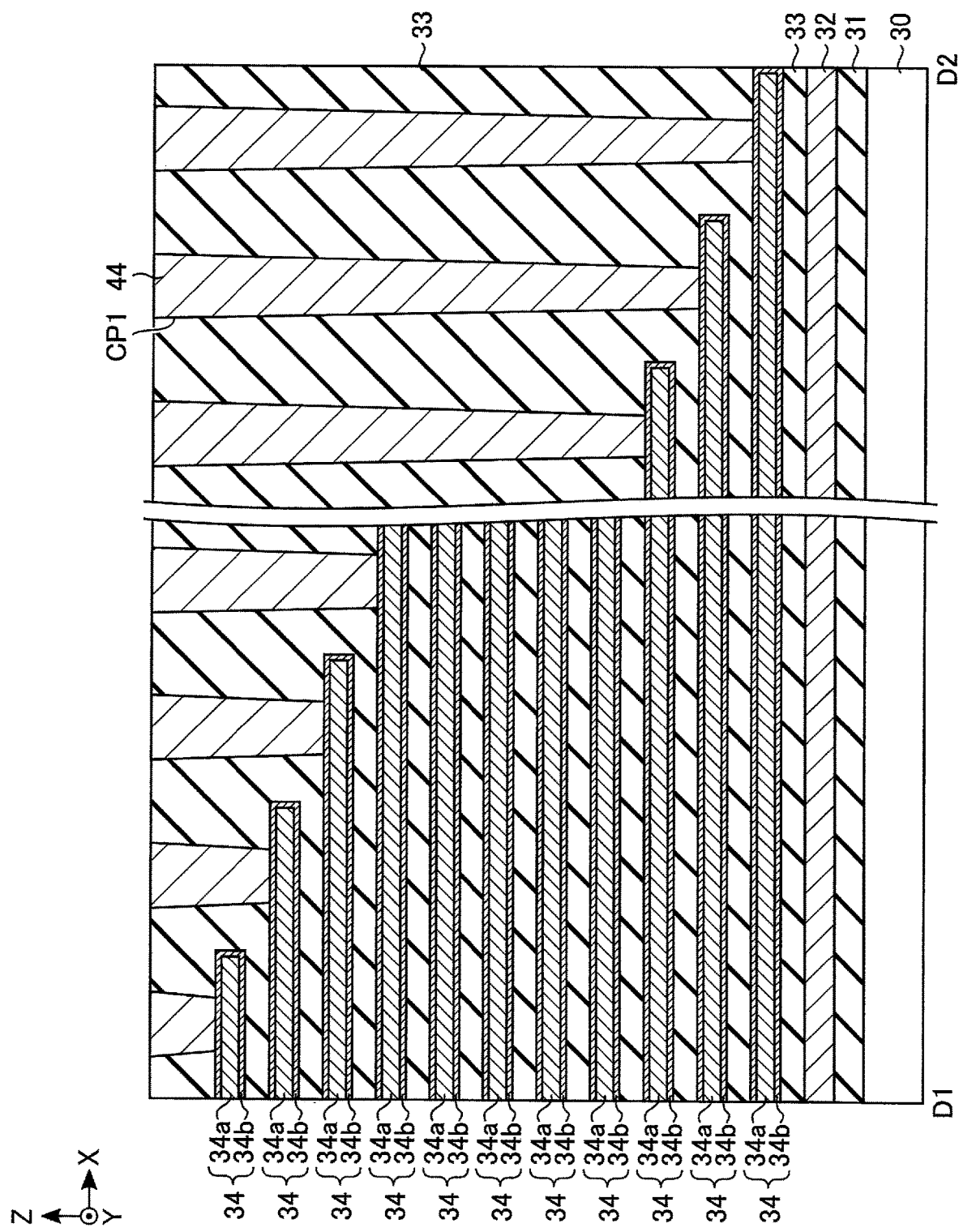
FIG. 8 is a cross-sectional view taken along line D1-D2 shown in FIG. 3.

Next, a cross-sectional configuration of the memory cell array 11 will be described with reference to FIGS. 4 to 8. FIG. 4 is a cross-sectional view taken along line A1-A2 shown in FIG. 3. FIG. 5 is a cross-sectional view taken along line B1-B2 shown in FIG. 3. FIG. 6 is an enlarged view a region RA shown in FIG. 4. FIG. 7 is a cross-sectional view taken along line C1-C2 shown in FIG. 3. FIG. 8 is a cross-sectional view taken along line D1-D2 shown in FIG. 3.

As shown in FIG. 4, an insulating layer 31 is provided on the semiconductor substrate 30. For example, silicon oxide ($SiO_2$) is used for the insulating layer 31. A circuit such as the row decoder 12 or the sense amplifier 13 may be provided in the area where the insulating layer 31 is provided, namely, between the semiconductor substrate 30 and the interconnect layer 32.

On the insulating layer 31, an interconnect layer 32 that functions as a source line SL is provided. The interconnect layer 32 is made of a conductive material; for example, an n-type semiconductor, a p-type semiconductor, or a metal material is used.

On the interconnect layer 32, 12 insulating layers 33 and 11 interconnect layers 34 are stacked alternately. The 11 interconnect layers 34 function as the select gate line SGS, the word lines WL0 to WL7, and the select gate lines SGDa and SGDb from the bottom. In the present embodiment, a case where the interconnect layer 34 is constituted by a conductor 34a and a conductor 34b will be described. The conductor 34b functions as a barrier layer of the conductor 34a, and covers part of the top surface, the bottom surface, and the side surface of the conductor 34a.

For example, $SiO_2$ is used for the insulating layer 33. The conductors 34a and 34b are made of a conductive material; for example, an n-type semiconductor, a p-type semiconductor, or a metal material is used. A case where tungsten (W) is used as the conductor 34a and titanium nitride (TiN) is used as the conductor 34b will be described. TiN has a function as a barrier layer for preventing reaction between W and $SiO_2$ or as an adhesion layer for improving adhesion of W when forming a film of W by CVD (chemical vapor deposition), for example.

A memory pillar MP, which penetrates (passes through) 12 insulating layers 33 and 11 interconnect layers 34 and has a bottom surface reaching the interconnect layer 32, is provided. The memory pillar MP includes a block insulating film 35, a charge storage layer 36, a tunnel insulating film 37, a semiconductor layer 38, a core layer 39, and a cap layer 40.

More specifically, a hole corresponding to a memory pillar MP is arranged in a manner that the hole penetrates the insulating layers 33 and the interconnect layers 34, and has a bottom surface reaching the interconnect layer 32. On the side surface of the hole, the block insulating film 35, the charge storage layer 36, and the tunnel insulating film 37 are laminated sequentially from the outer periphery. Then, the semiconductor layer 38 is arranged to have a side surface in contact with the tunnel insulating film 37 and a bottom surface in contact with the interconnect layer 32. The semiconductor layer 38 is a region where channels of the memory cell transistors MC and the selection transistors STa1, STb1, and ST2 are formed. Accordingly, the semiconductor layer 38 functions as a signal line coupling the current paths of the selection transistor ST2, the memory cell transistors MC0 to MC7, and the selection transistors STa1 and STb1. The core layer 39 is provided in the semiconductor layer 38. Above the semiconductor layer 38 and the core layer 39, the cap layer 40 having a side surface in contact with the tunnel insulating film 37 is provided.

The memory cell transistors MC0 to MC7 are respectively constituted by the memory pillar MP and eight interconnect layers 34 respectively functioning as word lines WL0 to WL7. Similarly, the selection transistors STa1, STb1, and ST2 are respectively constituted by the memory pillar MP and three interconnect layers 34 respectively functioning as the select gate lines SGDa, SGDb, and SGS.

For example, $SiO_2$ is used for the block insulating film 35, the tunnel insulating film 37, and the core layer 39. For example, silicon nitride (SiN) is used for the charge storage layer 36. For example, polysilicon is used for the semiconductor layer 38 and the cap layer 40.

A contact plug CP2 is provided on the cap layer 40. The contact plug CP2 is electrically coupled to an interconnect layer (not shown) functioning as a bit line BL. The inside of the contact plug CP2 is filled with a conductor 43. The conductor 43 is made of a conductive material; for example, an n-type semiconductor, a p-type semiconductor, or a metal material is used.

Slits SLT extending in the X direction are arranged to divide the 11 interconnect layers 34 for respective blocks BLK. The inside of the slit SLT is filled with an insulating layer 41. For example, $SiO_2$ is used for the insulating layer 41.

Slits SHE extending in the X direction are arranged to divide two interconnect layers 34 functioning as the select gate lines SGDa and SGDb for respective string units SU. Between adjacent string units SU, a plurality of dummy pillars DP are arranged along the X direction under the slit SHE. The dummy pillar DP penetrates 12 insulating layers 33 and 11 interconnect layers 34, and has a bottom surface reaching the interconnect layer 32. The inside of the slits SHE and the dummy pillars DP is filled with an insulating layer 42. For example, $SiO_2$ is used for the insulating layer 42.

As shown in FIG. 5, the upper parts of the plurality of dummy pillars DP arranged along the X direction are connected by the slit SHE.

Next, the interconnect layer 34 will be described in detail.

As shown in FIG. 6, in the present embodiment, the sacrificial layers are removed through the slits SHE and side surfaces of the dummy pillars DP to form gaps in the replacement. The conductors 34b, having a small film thickness not to fill the gaps, are formed, and the gaps are then filled by forming the conductors 34a. Accordingly, the conductor 34b is provided between the conductor 34a and the insulating layer 33, and between the conductor 34a and the side surfaces of the slit SLT and the memory pillar MP. The conductor 34b is not provided between the conductor 34a and the side surfaces of the dummy pillar DP and the slit SHE. In other words, the conductor 34b is formed on the top surface and the bottom surface of the conductor 34a, and on the side surface of the conductor 34a facing the slit SLT and the memory pillar MP. The conductor 34a is in contact with the side surfaces of the dummy pillar DP and the slit SHE.

Accordingly, the conductors 34b of the interconnect layers 34 functioning as word lines WL and the select gate line SGS cover the side surfaces of both ends of the conductors 34a in the Y direction. The conductors 34b of the interconnect layers 34 functioning as select gate lines SGDa0, SGDa4, SGDb0, and SGDb4 cover the side surfaces of one end of the conductors 34a in the Y direction. The conductors 34b of the interconnect layers 34 functioning as select gate lines SGDa1, SGDa2, SGDa3, SGDb1, SGDb2, and SGDb3 do not cover the side surfaces of the end portions of the conductors 34a in the Y direction.

Insulating layers made of a high-k dielectric material (e.g. aluminum oxide) may be provided to cover the conductors 34b. More specifically, an insulating layer may be provided between the conductor 34b and the insulating layer 33, and between the conductor 34b and the side surfaces of the slit SLT and the memory pillar MP. A gap may be formed inside the conductor 34a. In this case, for example, a gap may be formed inside the conductor 34a in a manner that the gap extends in the Y direction from side surfaces of the slit SHE and the dummy pillar DP.

Next, the dummy pillars HR1 and HR2 in the CP1 coupling portion will be described.

As shown in FIG. 7, the dummy pillar HR1 penetrates the 12 insulating layers 33 and the 11 interconnect layers 34, and has a bottom surface reaching the interconnect layer 32. The inside of the dummy pillar HR1 is filled with the insulating layer 42, similarly to the slit SHE and the dummy pillar DP. At the time of replacement, in the CP1 coupling portion, the sacrificial layers are removed through the side surface of the dummy pillar HR1 to form gaps. Accordingly, the conductor 34b is provided between the conductor 34a and the insulating layer 33, and between the conductor 34a and the side surface of the dummy pillar HR2. The conductor 34b is not formed between the conductor 34a and the side surface of the dummy pillar HR1.

The dummy pillar HR2 penetrates the 12 insulating layers 33 and the 11 interconnect layers 34, and has a bottom surface reaching the interconnect layer 32. The dummy pillar HR2 includes the block insulating film 35, the charge storage layer 36, the tunnel insulating film 37, the semiconductor layer 38, the core layer 39, and the cap layer 40, similarly to the memory pillar MP. A contact plug CP2 is not provided above the dummy pillar HR2, which is different from the memory pillar MP. The dummy pillar HR2 may have a different configuration from that of the memory pillar MP.

Next, the contact plug CP1 will be described.

As shown in FIG. 8, the 11 interconnect layers 34 have the end portions in the X direction from the cell portion toward the CP1 coupling portion that are drawn stepwise. In other words, the terraces of the select gate lines SGDb and SGDa, the word lines WL7 to WL0, and the select gate line SGS are sequentially arranged from the cell portion toward the CP1 coupling portion. A contact plug CP1 is provided on each terrace. The inside of the contact plug CP1 is filled with a conductor 44. The conductor 44 is made of a conductive material; for example, an n-type semiconductor, a p-type semiconductor, or a metal material is used.

2. Method of Manufacturing Memory Cell Array

Next, a method of manufacturing the memory cell array 11 will be described with reference to FIGS. 9 to 19. FIGS. 9 to 19 show cross sections taken along line A1-A2 (hereinafter referred to as "A1-A2 cross section") and cross sections taken along line C1-C2 (hereinafter referred to as "C1-C2 cross section"). In the present embodiment, a case of collectively forming holes corresponding to the memory pillars MP and the dummy pillars DP, HR1, and HR2 will be described.

Figure 9:
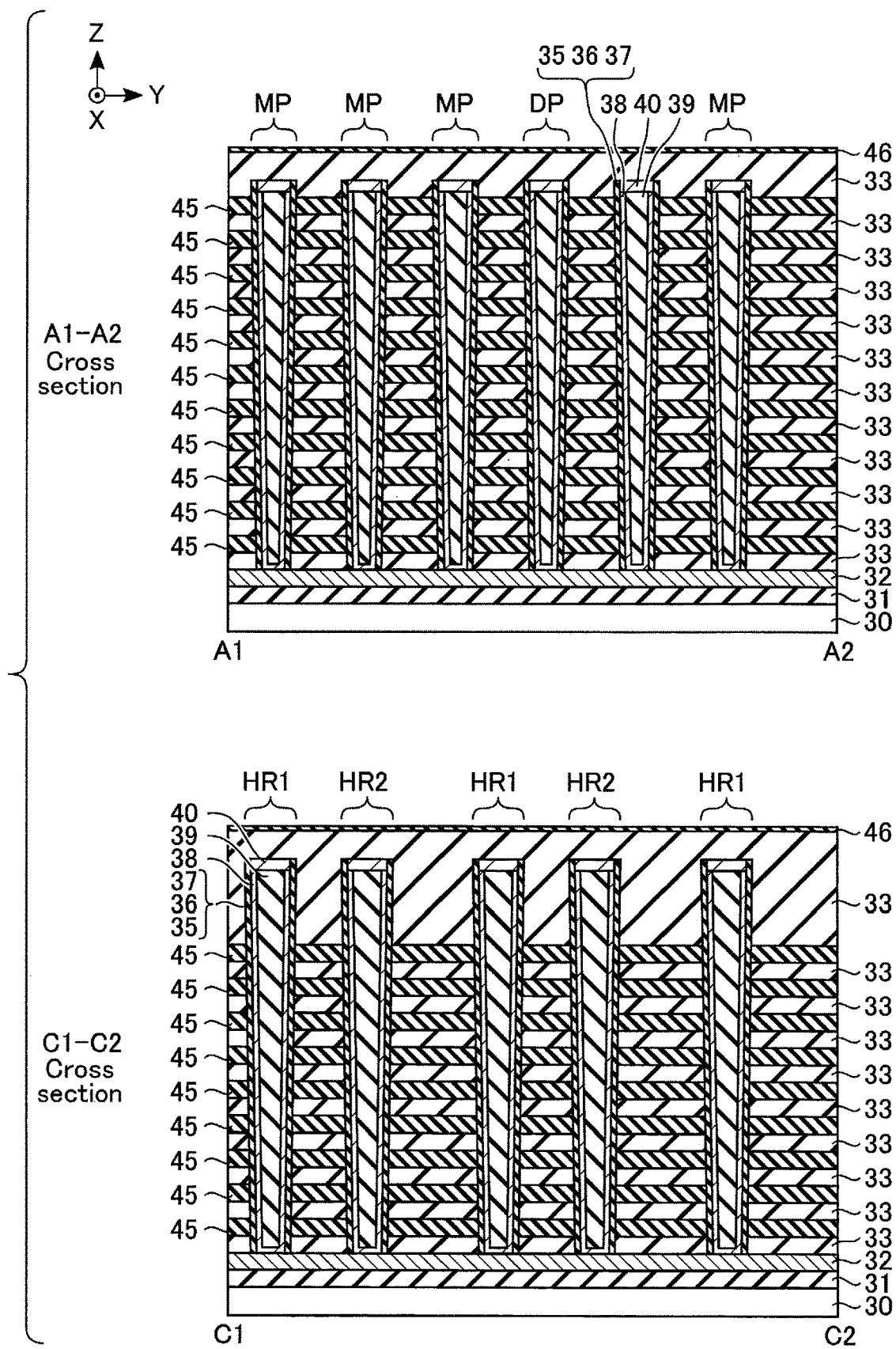

As shown in FIG. 9, on a semiconductor substrate 30, an insulating layer 31 is first formed, and then an interconnect layer 32 is formed. On the interconnect layer 32, for example, 12 insulating layers 33 and 11 sacrificial layers 45 corresponding to the interconnect layers 34 are stacked alternately. The 11 sacrificial layers 45 will be replaced with interconnect layers 34 by replacement in the steps described later. The sacrificial layers 45 may be made of a material capable of obtaining sufficient etching selection ratio with respect to the insulating layers 33. Hereinafter, a case of using SiN for the sacrificial layers 45 will be described.

Next, a plurality of holes respectively corresponding to the memory pillars MP and the dummy pillars DP, HR1, and HR2 are formed. Then, a block insulating film 35, a charge storage layer 36, a tunnel insulating film 37, a semiconductor layer 38, a core layer 39, and a cap layer 40 are sequentially formed inside each hole. In other words, the memory pillars MP and the dummy pillars DP, HR1, and HR2 having the same structure are formed.

More specifically, first, the block insulating film 35, the charge storage layer 36, and the tunnel insulating film 37 are stacked. Next, the block insulating film 35, the charge storage layer 36, and the tunnel insulating film 37 on the uppermost insulating layer 33 and on the bottom portion of each hole (i.e. on the interconnect layer 32) are removed by, for example, anisotropic etching such as reactive ion etching (RIE). As a result, the block insulating film 35, the charge storage layer 36, and the tunnel insulating film 37 are arranged on the side surface of the hole sequentially from the outer periphery. Next, the semiconductor layer 38 and the core layer 39 are sequentially formed to fill the inside of the hole for the moment. Then, the semiconductor layer 38 and the core layer 39 on the uppermost insulating layer 33 are removed. At this time, the top surfaces of the semiconductor layer 38 and the core layer 39 are set to be lower than the opening of the hole. The upper part of the hole is then filled with a cap layer 40. Next, the cap layer 40 on the uppermost insulating layer 33 is removed.

Then, an insulating layer 33 is formed to cover the top surfaces of the memory pillars MP and the dummy pillars DP, HR1, and HR2.

After that, the surface of the insulating layer 33 is planarized by, for example, chemical mechanical polishing (CMP), and an insulating layer 46 is subsequently formed. Hereinafter, a case of using SiN for the insulating layer 46 will be described.

Figure 10:
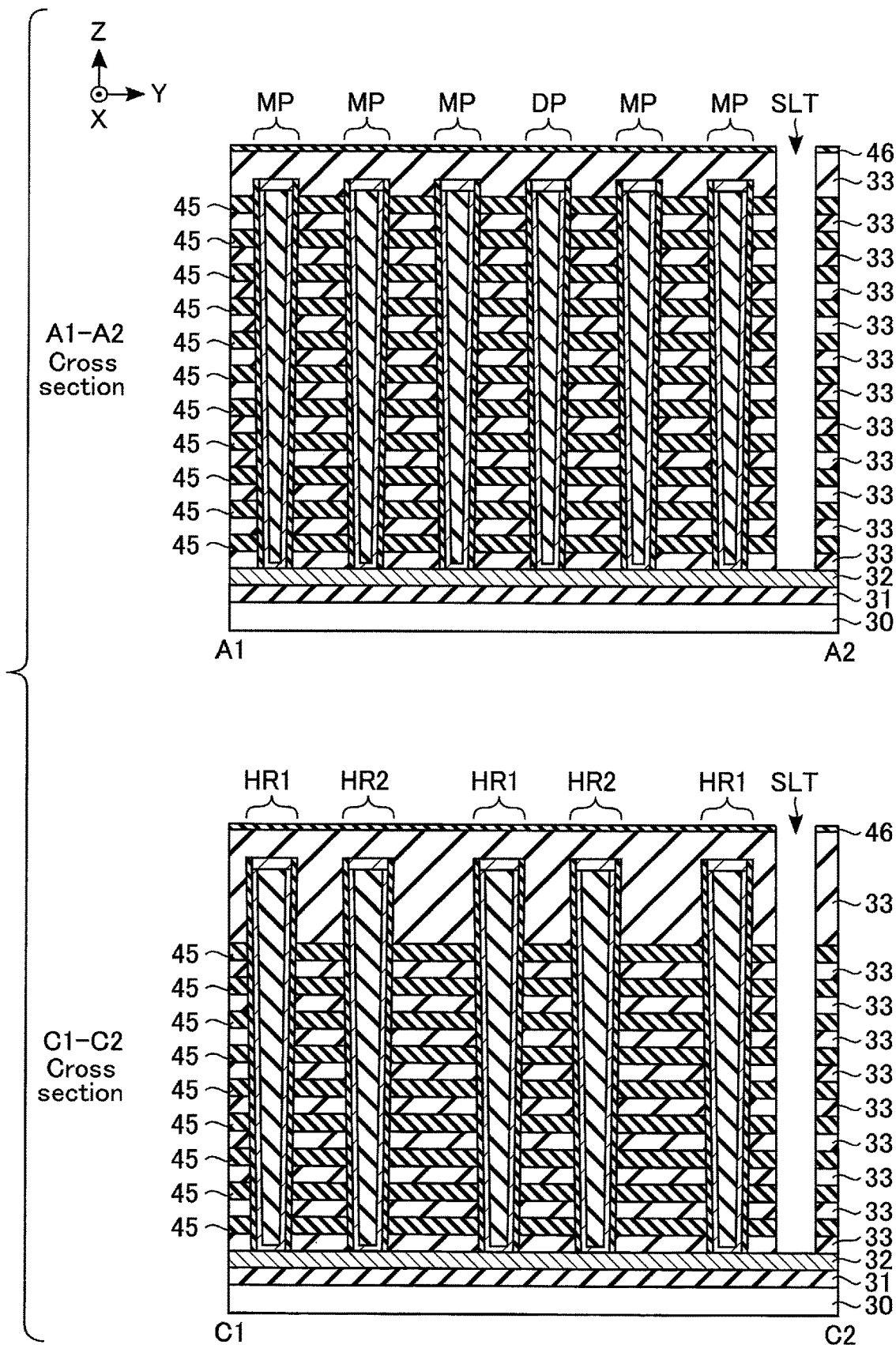

As shown in FIG. 10, a slit SLT having a bottom surface reaching the interconnect layer 32 is formed.

Figure 11:
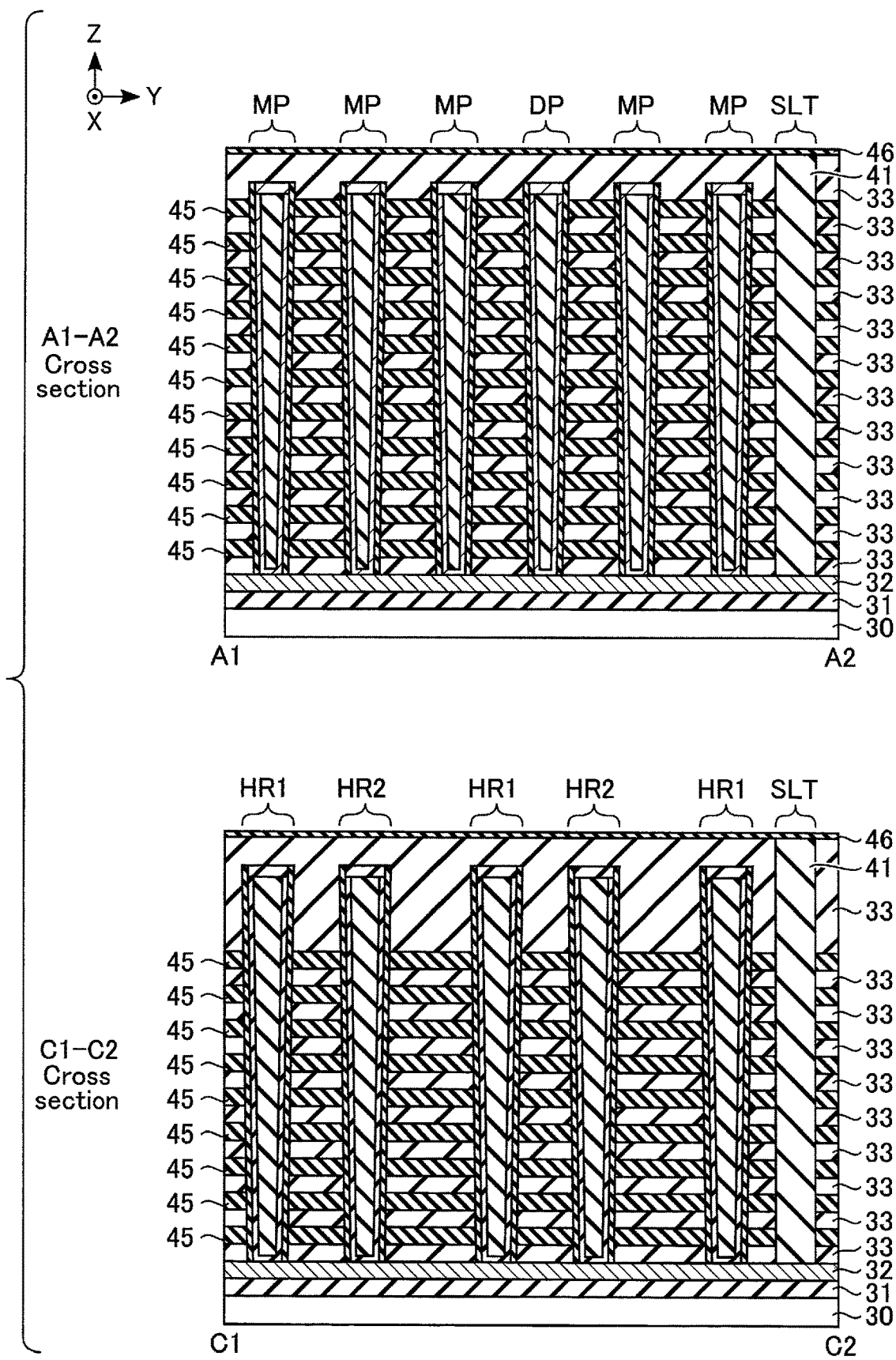

As shown in FIG. 11, the slit SLT is filled with an insulating layer 41. Next, an insulating layer 46 is formed on the insulating layer 41.

Figure 12:
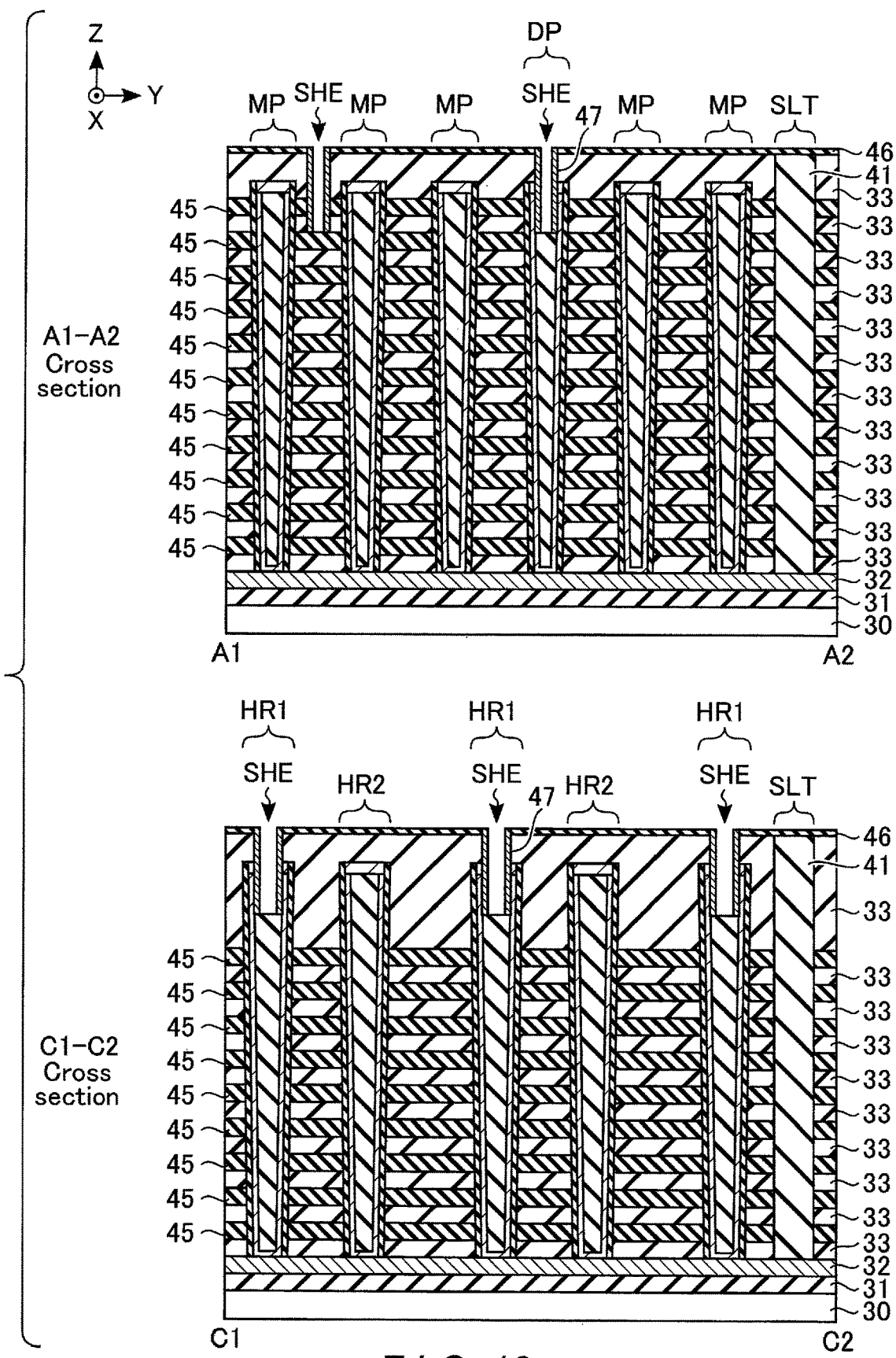

As shown in FIG. 12, slits SHE on the dummy pillars DP and HR1 are formed at the same time. The slit SHE on the dummy pillar DP has a depth reaching the sacrificial layer 45 corresponding to the select gate line SGDa. The width of the slit SHE in the Y direction is smaller than the diameter of the dummy pillar DP in the Y direction. The slit SHE on the dummy pillar HR1, for example, has a rectangular shape. The slit SHE on the dummy pillar HR1 is preferably smaller than the top surface of the dummy pillar HR1. Alternatively, a round hole may be formed on the dummy pillar HR1. A slit SHE connecting a plurality of dummy pillars HR1 may also be formed.

Next, a semiconductor layer 47 is formed on the side surface of the slit SHE. More specifically, a semiconductor layer 47 having a small film thickness not to fill the slit SHE is formed by CVD with good step-coverage. Then, the semiconductor layer 47 on the insulating layer 46 and at the bottom portions of the slits SHE is removed by anisotropic etching such as RIE.

Figure 13:
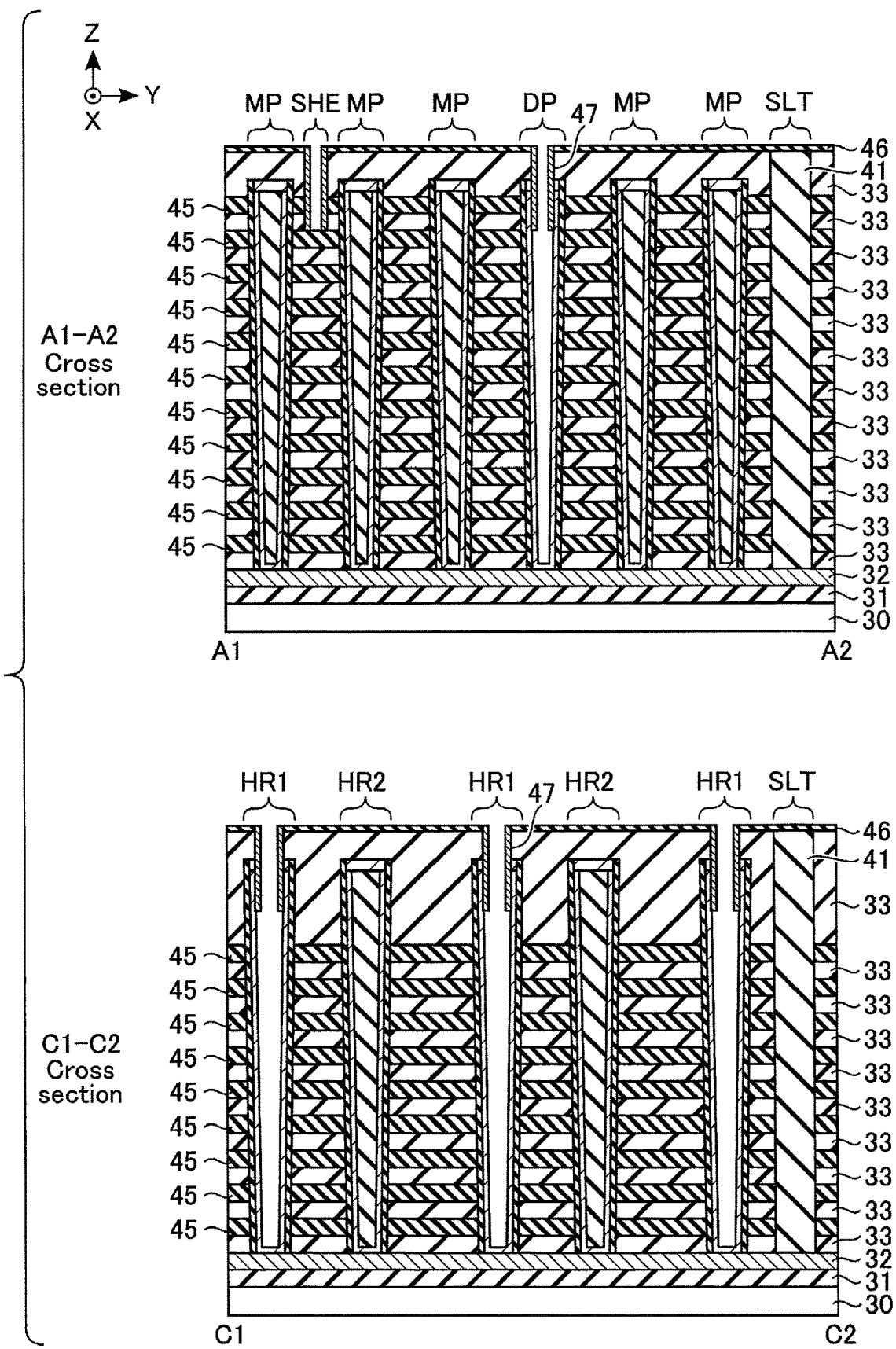

As shown in FIG. 13, the core layer 39 in the dummy pillars DP and HR1 that is exposed to the bottom portions of the slits SHE is removed by, for example, wet etching.

Figure 14:
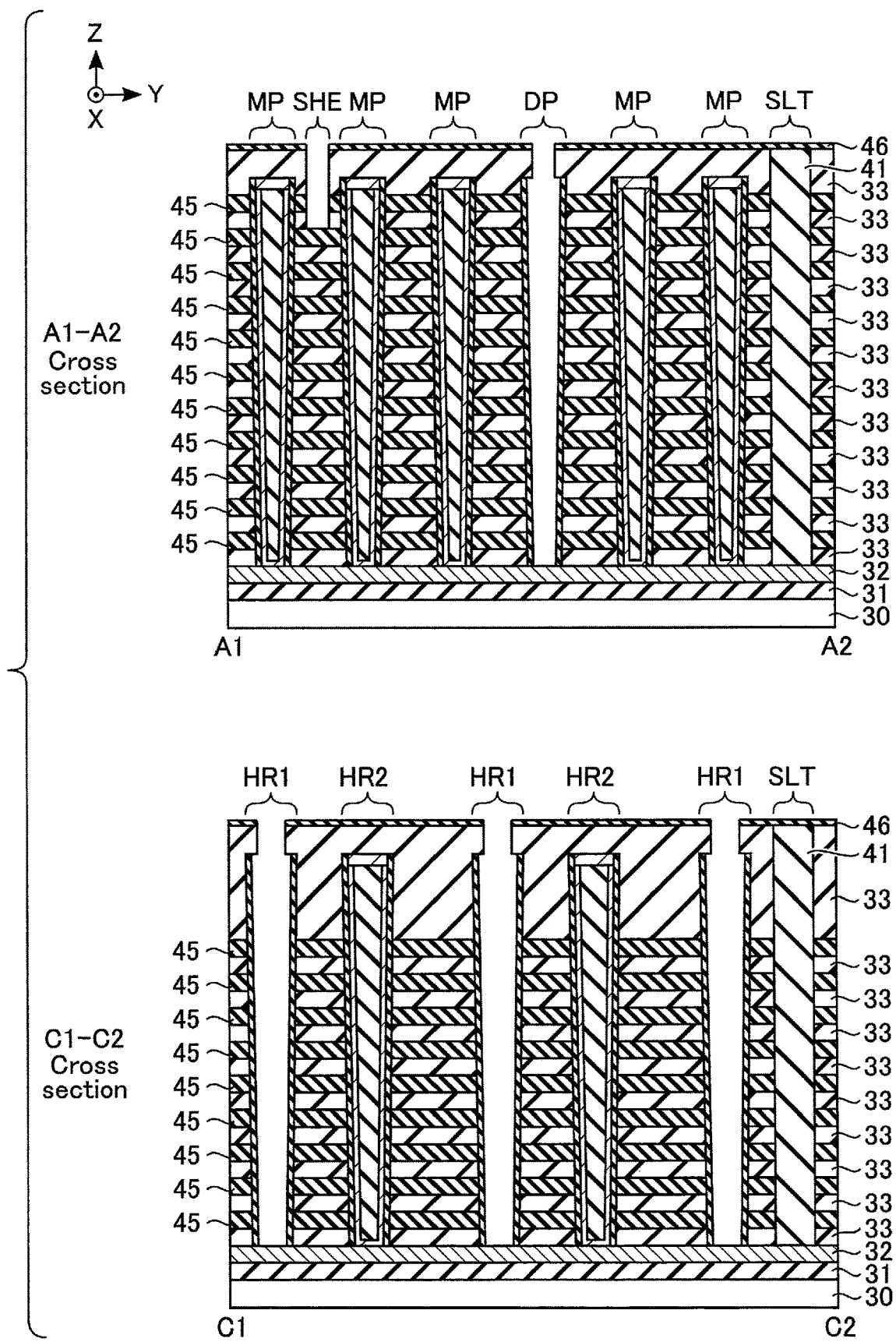

As shown in FIG. 14, the semiconductor layer 38, the cap layer 40, and the semiconductor layer 47 in the slits SHE and the dummy pillars DP and HR1 are removed by, for example, wet etching.

Figure 15:
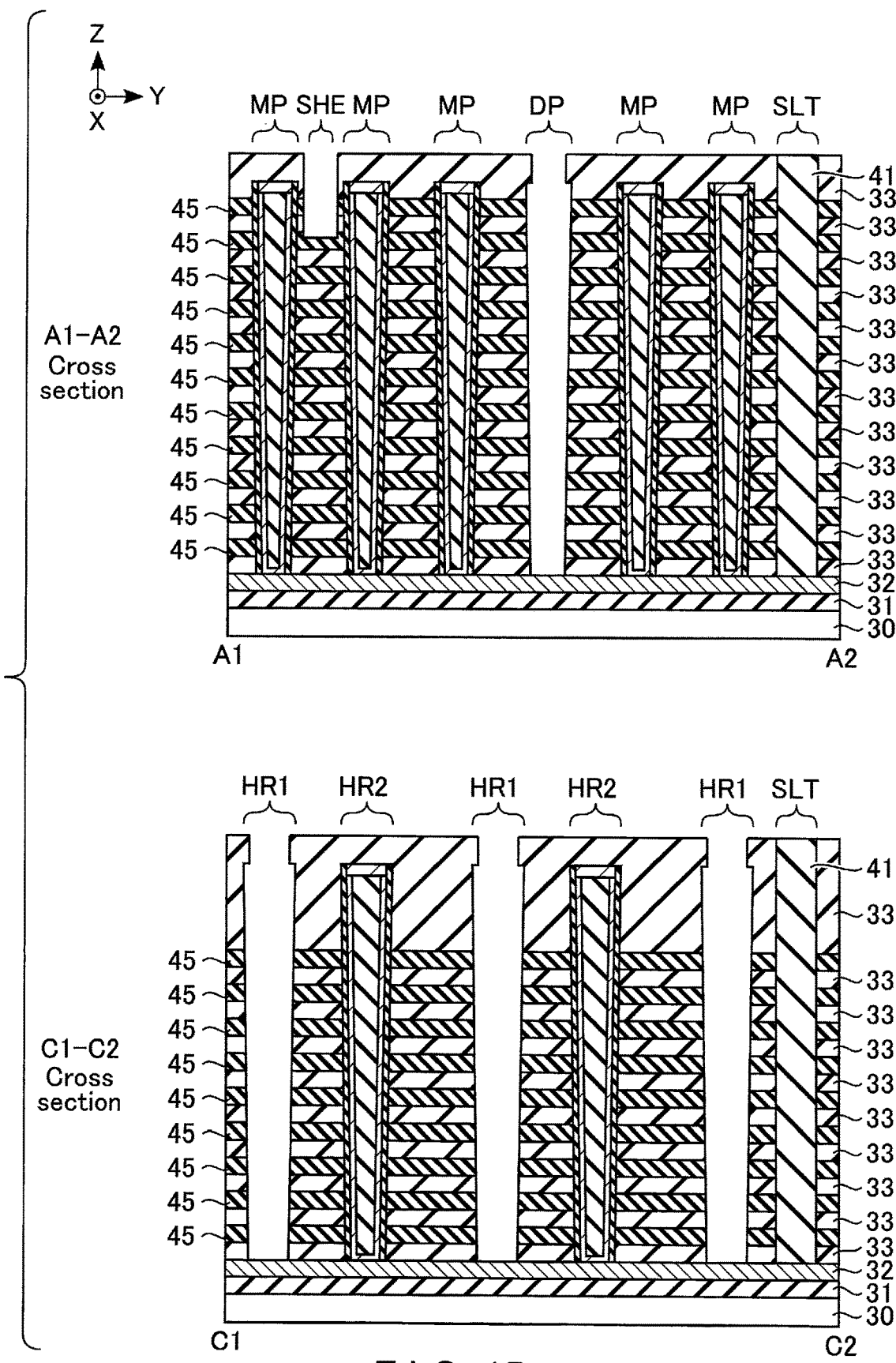

As shown in FIG. 15, the tunnel insulating film 37 in the dummy pillars DP and HR1 is removed by, for example, wet etching. Next, the charge storage layer 36 in the dummy pillars DP and HR1 and the insulating layer 46 are removed by, for example, wet etching. Then, the block insulating film 35 in the dummy pillars DP and HR1 is removed by, for example, wet etching. The width of the slit SHE in the Y direction at this time is larger than the width right after the formation of the slit SHE due to the wet etching.

As shown in FIG. 16, the sacrificial layers 45 are removed through the side surfaces of the slits SHE and the dummy pillars DP and HR1 by, for example, wet etching. As a result, gaps AG are formed between the separately stacked insulating layers 33. By then, the insulating layer 46 on the uppermost insulating layer 33 is wholly removed.

Figure 17:
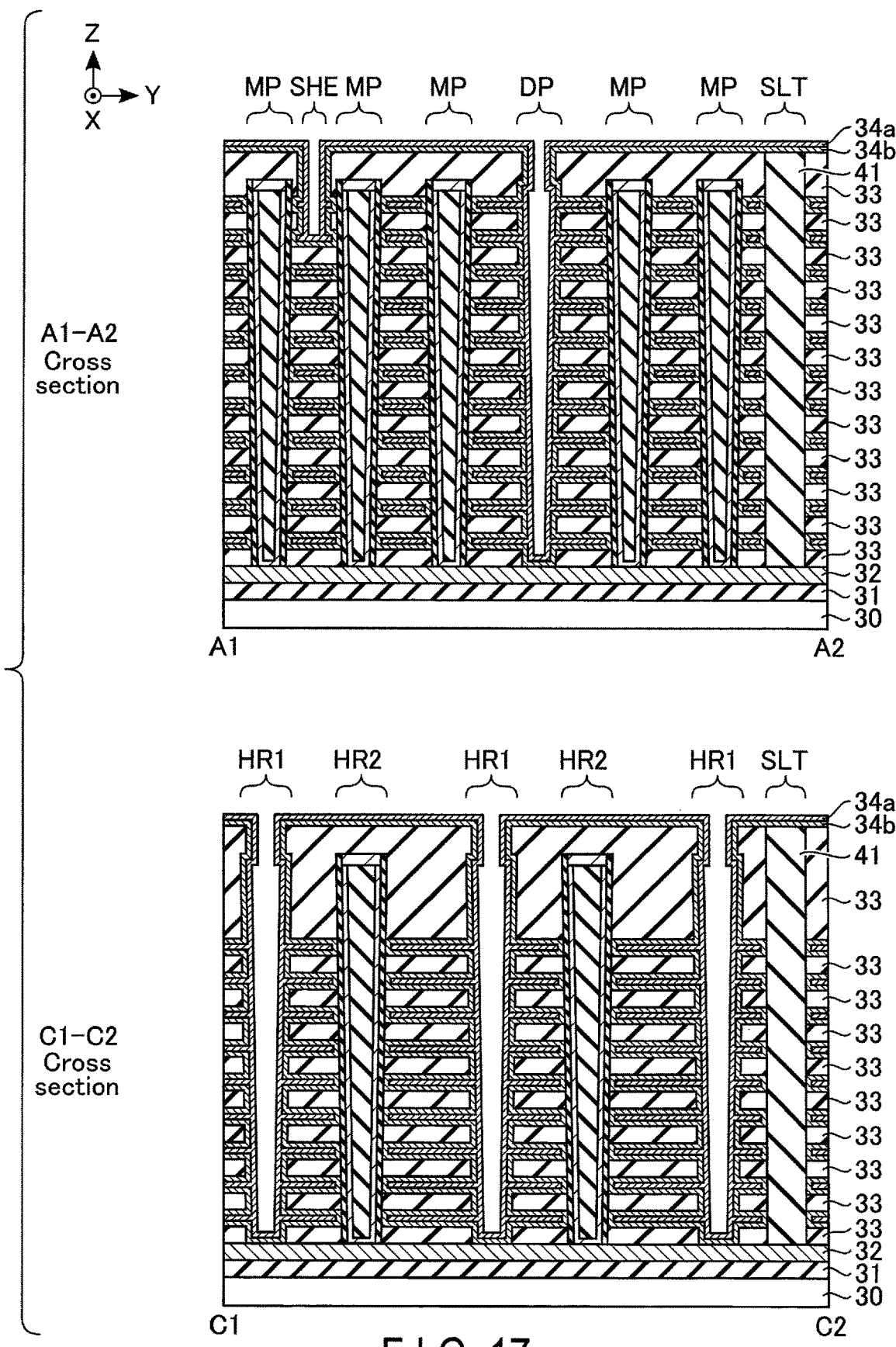

As shown in FIG. 17, conductors 34b having a film thickness so as not to fill the gaps AG are formed by using, for example, CVD or atomic layer deposition (ALD) with good step-coverage. Next, the gaps AG are filled by using CVD or ALD with good step-coverage, thereby forming conductors 34a having a film thickness so as not to fill the slits SHE and the dummy pillars DP and HR1.

Figure 18:
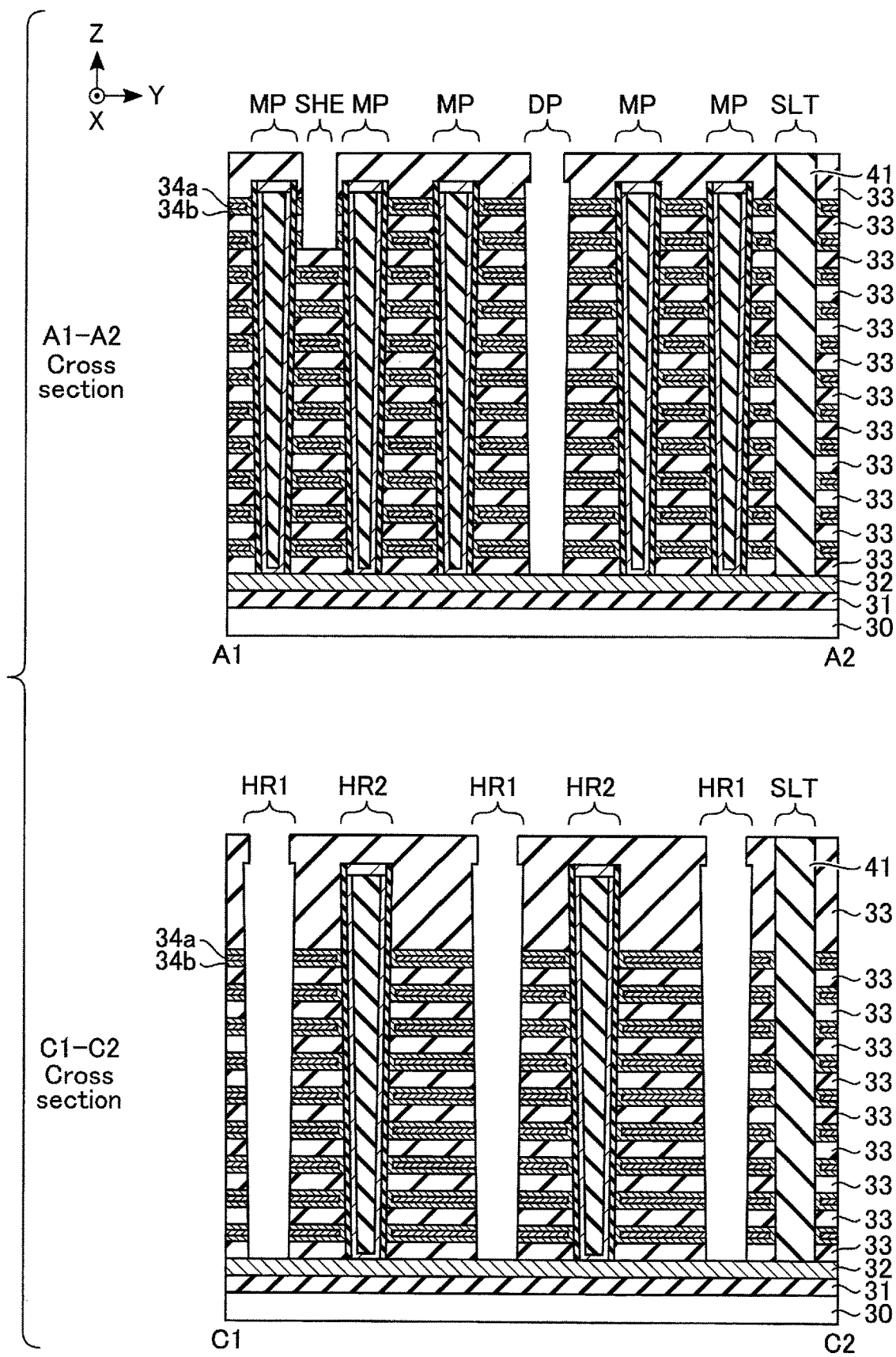

As shown in FIG. 18, the conductors 34a and 34b formed on the uppermost insulating layer 33, the side surfaces and the bottom surfaces of the slits SHE, and the side surfaces and the bottom surfaces of the dummy pillars DP and HR1 are removed by, for example, wet etching.

As shown in FIG. 19, the slits SHE and the dummy pillars DP and HR1 are filled with an insulating layer 42.

3. Advantageous Effect of Present Embodiment

The configuration according to the present embodiment can provide a semiconductor memory device capable of improving reliability. Details of the effect will be described.

If the word lines WL are formed by replacement, the interconnect layers may be formed by removing the sacrificial layers through the slits SLT. In this case, if the number of memory pillars MP arranged in the Y direction between a pair of slits SLT extending in the X direction increases, the width between the pair of slits SLT increases. This increases the lengths of the sacrificial layers to be etched from the slits SLT, which leads to an increase in time taken for wet-etching of the sacrificial layers. Accordingly, between the memory pillars MP in the vicinity of the slits SLT and the memory pillars MP near the central position between the pair of slits SLT, there is a difference in the time duration to be exposed to the etching solution, which leads to a difference in the damage done to (or the etching amount of) the block insulating film by wet etching, for example. Because of this, the characteristics of the memory cell transistors MC may vary, and reliability may be lowered.

On the other hand, in the configuration according to the present embodiment, if the word lines WL are formed by replacement, the sacrificial layers 45 can be removed by using the slits SHE provided between the slits SLT, and the dummy pillars DP connected by the slits SHE. This can reduce the etching length of the sacrificial layers 45, and also reduce the time duration for wet etching. Accordingly, it is possible to reduce variation in the time duration for the memory pillars MP to be exposed to the etching solution. Therefore, it is possible to reduce the variation in characteristics of the memory cell transistors MC, and improve the reliability of the semiconductor memory device.

4. Modifications

According to the above embodiment, a semiconductor memory device includes: a plurality of first interconnect layers (WL) stacked separately in a first direction that intersects a substrate, and each including a first conductor (34a) and a second conductor (34b) covering a part of the first conductor; a second interconnect layer (SGDa0) arranged above the plurality of first interconnect layers; a third interconnect layer (SGDa1) arranged above the plurality of first interconnect layers, and arranged adjacently to the second interconnect layer in a second direction that is parallel to the substrate and intersects the first direction; a first pillar (MP) passing through the plurality of first interconnect layers and the second interconnect layer, extending in the first direction, and including a first semiconductor layer (38); a second pillar (MP) passing through the plurality of first interconnect layers and the third interconnect layer, extending in the first direction, and including a second semiconductor layer (38); and a third pillar (DP) arranged between the second interconnect layer and the third interconnect layer in the second direction, passing through the plurality of first interconnect layers, extending in the first direction, and having an insulation property. The second conductor covers a top surface and a bottom surface of the first conductor, and a side surface of an end portion of the first conductor in the second direction.

By applying the above embodiment, a semiconductor memory device with increased reliability can be provided.

The embodiment is not limited to the above-described aspects, but can be modified in various ways.

For example, although the inside of the slit SLT is filled with the insulating layer 41 in the above embodiment, the slit SLT may include therein a conductor for electrically coupling the interconnect layer 32 below the slit SLT to the interconnect layer provided above the slit SLT.

Furthermore, although the memory pillars MP and the dummy pillars DP, HR1, and HR2 are formed simultaneously in the above embodiment, holes respectively corresponding to these pillars may be formed separately.

Moreover, although the above embodiment describes the case where the memory pillar MP and the dummy pillar HR2 have the same configuration, they may have different configurations.

The term "couple" in the above-described embodiment includes the state of indirect coupling via another component such as a transistor or a resistor.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a plurality of first interconnect layers stacked separately in a first direction that intersects a substrate, and each including a first conductor and a second conductor covering a part of the first conductor;
a second interconnect layer arranged above the plurality of first interconnect layers;
a third interconnect layer arranged above the plurality of first interconnect layers, and arranged adjacently to the second interconnect layer in a second direction that is parallel to the substrate and intersects the first direction;
a first pillar passing through the plurality of first interconnect layers and the second interconnect layer, extending in the first direction, and including a first semiconductor layer;
a second pillar passing through the plurality of first interconnect layers and the third interconnect layer, extending in the first direction, and including a second semiconductor layer;
a third pillar arranged between the second interconnect layer and the third interconnect layer in the second direction, passing through the plurality of first interconnect layers, extending in the first direction, and having an insulation property; and
a first insulator having a side surface in contact with the plurality of first interconnect layers and the second interconnect layer, and extending in a third direction intersecting the first and second directions,
wherein the second conductor covers a top surface and a bottom surface of the first conductor, and a side surface of an end portion of the first conductor in the second direction, and
the second conductor is arranged between the first insulator and the end portion of the first conductor in the second direction.

2. The device according to claim 1, wherein the second conductor is arranged between the first pillar and the first conductor.

3. The device according to claim 1, wherein the first conductor is in contact with the third pillar.

4. The device according to claim 1, further comprising a second insulator extending between the second interconnect layer and the third interconnect layer in the third direction,
wherein the second interconnect layer includes a third conductor and a fourth conductor covering a part of the third conductor, and
the third conductor is in contact with the second insulator at an end portion of the second interconnect layer facing the third interconnect layer.

5. The device according to claim 4, wherein the fourth conductor is arranged between the first pillar and the third conductor.

6. The device according to claim 4, wherein the second insulator is coupled to an upper part of the third pillar.

7. The device according to claim 1, wherein
the first and second pillars include a charge storage layer, and
the third pillar does not include the charge storage layer.

8. The device according to claim 1, further comprising a fourth interconnect layer arranged below the plurality of first interconnect layers, wherein the first and second semiconductor layers are coupled to the fourth interconnect layer.

9. The device according to claim 8, wherein the third pillar is arranged on the fourth interconnect layer.

10. The device according to claim 1, further comprising:
a plurality of contact plugs respectively arranged on the plurality of first interconnect layers; and
a fourth pillar arranged in a region where the plurality of first interconnect layers are respectively coupled to the plurality of contact plugs, passing through the plurality of first interconnect layers, extending in the first direction, and having an insulation property.

11. The device according to claim 10, further comprising a fifth pillar arranged in the region, passing through the plurality of first interconnect layers, extending in the first direction, and including a third semiconductor layer.

12. The device according to claim 10, wherein the first conductor is in contact with the fourth pillar.

13. The device according to claim 11, wherein the second conductor is arranged between the fifth pillar and the first conductor.

14. A semiconductor memory device comprising:
a plurality of first interconnect layers stacked separately in a first direction that intersects a substrate, and each including a first conductor and a second conductor covering a part of the first conductor;
a second interconnect layer arranged above the plurality of first interconnect layers;
a third interconnect layer arranged above the plurality of first interconnect layers, and arranged adjacently to the second interconnect layer in a second direction that is parallel to the substrate and intersects the first direction;
a first pillar passing through the plurality of first interconnect layers and the second interconnect layer, extending in the first direction, and including a first semiconductor layer;
a second pillar passing through the plurality of first interconnect layers and the third interconnect layer, extending in the first direction, and including a second semiconductor layer;
a third pillar arranged between the second interconnect layer and the third interconnect layer in the second direction, passing through the plurality of first interconnect layers, extending in the first direction, and having an insulation property;
a first insulator having a side surface in contact with the plurality of first interconnect layers and the second interconnect layer, and extending in a third direction that is parallel to the substrate and intersects the first and second directions; and
a second insulator extending between the second interconnect layer and the third interconnect layer in the third direction,
wherein the first conductor is in contact with the third pillar, and the second conductor is arranged between the first insulator and an end portion of the first conductor in the second direction.

* * * * *